United States Patent
Choi et al.

(10) Patent No.: US 11,099,784 B2
(45) Date of Patent: Aug. 24, 2021

(54) CROSSPOINT MEMORY ARCHITECTURE FOR HIGH BANDWIDTH OPERATION WITH SMALL PAGE BUFFER

(71) Applicant: SanDisk Technologies LLC, Addison, TX (US)

(72) Inventors: Won Ho Choi, San Jose, CA (US); Ward Parkinson, Boise, ID (US); Raj Ramanujan, Federal Way, WA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/717,468

(22) Filed: Dec. 17, 2019

(65) Prior Publication Data

US 2021/0181979 A1 Jun. 17, 2021

(51) Int. Cl.
*G06F 3/06* (2006.01)
*G11C 13/00* (2006.01)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC ......... H01L 2924/0002; H01L 2924/00; H01L 27/11578; H01L 23/5225; H01L 27/1157; H01L 27/224; H01L 27/2454; H01L 27/2463; H01L 43/10; H01L 43/12; H01L 45/04; H01L 45/1233; H01L 45/145; H01L 45/146; H01L 45/1608; H01L 27/2427; H01L 43/02; H01L 43/08; H01L 45/085; G11C 16/0483; G11C 16/04; G11C 16/24; G11C 16/26; G11C 2216/14; G11C 16/06; G11C 11/34; G11C 13/003; G11C 11/1659; G11C 11/1675; G11C 13/0069;
(Continued)

(56) References Cited

U.S. PATENT DOCUMENTS 7,227,767 B2  6/2007 Rinerson et al.
8,072,794 B2  12/2011 Katagiri et al.
(Continued)

OTHER PUBLICATIONS

International Search Report & The Written Opinion of the International Searching Authority dated Sep. 9, 2020, International Application No. PCT/US2020/024151.

*Primary Examiner* — Thong Q Le
(74) *Attorney, Agent, or Firm* — Vierra Magen Marcus LLP

(57) ABSTRACT

Apparatuses and techniques are described for reading crosspoint arrays of memory cells with high bandwidth and a relatively small page buffer. Multiple crosspoint arrays (XPAs) are read in parallel, with one memory cell per XPA being read, in a bank of XPAs. To reduce the read time, a row can be selected for the XPAs, after which memory cells in different columns are read, one column at a time, while the same row is selected. This avoids the need to transmit commands and a row address for re-selecting the row in each successive read operation. The XPAs may be ungrouped, or one XPA may be accessible at a time in a group. In one option, the XPAs are arranged in sets, either individually or in groups, and one set is accessible at a time.

19 Claims, 20 Drawing Sheets

(52) U.S. Cl.
CPC ........ *G11C 13/0004* (2013.01); *G11C 13/004* (2013.01); *G11C 13/0026* (2013.01); *G11C 13/0028* (2013.01); *G11C 2013/0045* (2013.01)

(58) Field of Classification Search
CPC ............ G11C 2213/76; G11C 13/0002; G11C 13/0011; G11C 2013/009; G11C 2213/71; G11C 11/161; G11C 11/1655; G11C 11/1657; G11C 11/1673; G11C 13/0004; G11C 13/0023
USPC ............ 365/185.05, 185.11, 185.13, 185.17, 365/185.18, 130, 185.02, 185.25, 189.11, 365/189.16, 203, 204, 63
See application file for complete search history.

(56) References Cited

U.S. PATENT DOCUMENTS

| | | |
|---|---|---|
| 8,183,565 B2 | 5/2012 | Parkinson |
| 8,867,300 B2 | 10/2014 | Ueda |
| 9,135,982 B2 | 9/2015 | Schaefer et al. |
| 9,312,002 B2 | 4/2016 | Navon et al. |
| 10,311,921 B1 | 6/2019 | Parkinson et al. |
| 10,373,682 B2 | 8/2019 | Parkinson et al. |
| 10,403,683 B2 | 9/2019 | Bertin et al. |
| 2011/0007592 A1 | 1/2011 | Tashiro |
| 2012/0182804 A1* | 7/2012 | Hung ................ H01L 27/11578 365/185.13 |
| 2015/0221358 A1 | 8/2015 | Brandl |
| 2016/0155484 A1 | 6/2016 | Lin et al. |
| 2018/0301188 A1 | 10/2018 | Choi et al. |
| 2019/0332278 A1 | 10/2019 | Sundaram et al. |

* cited by examiner

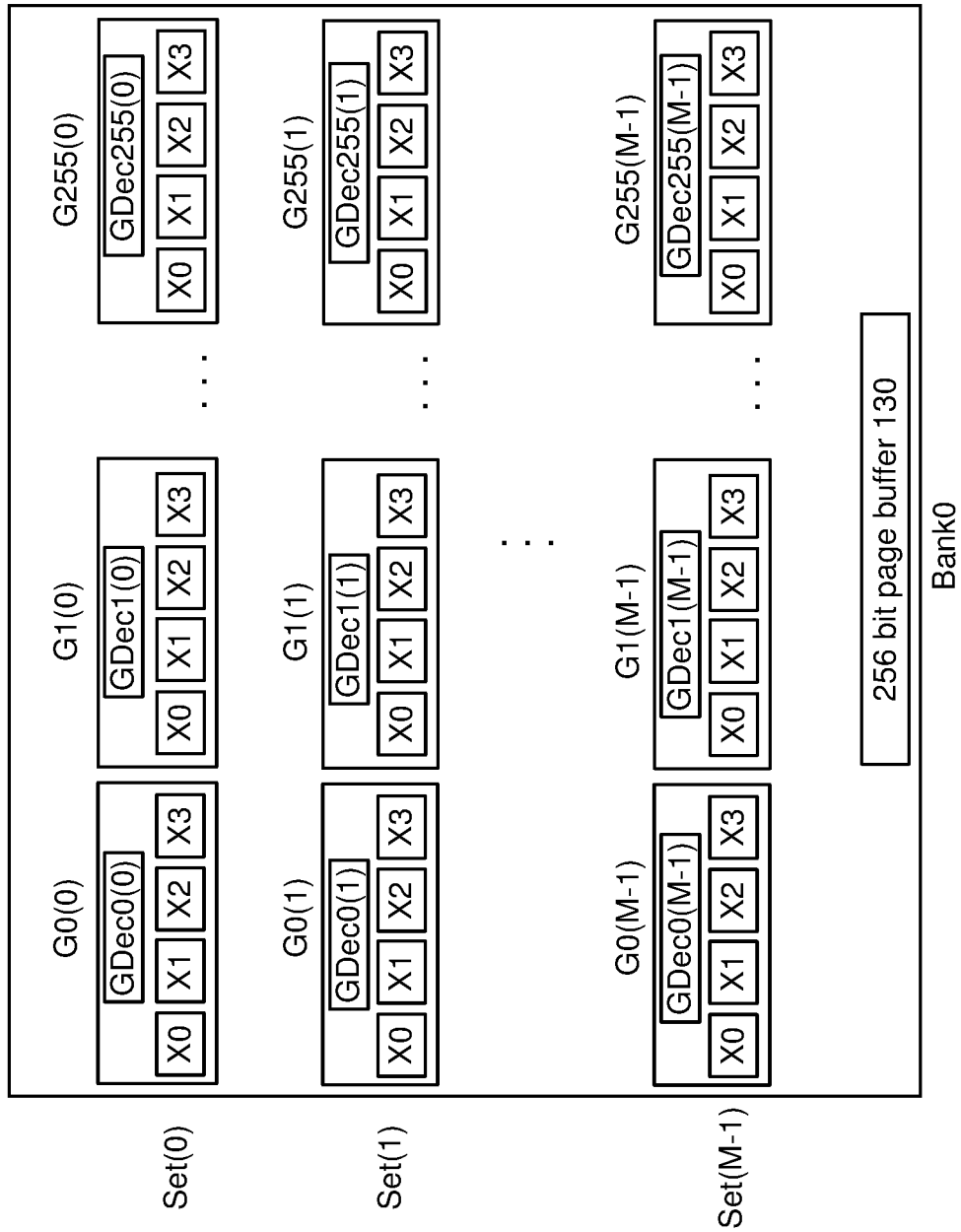

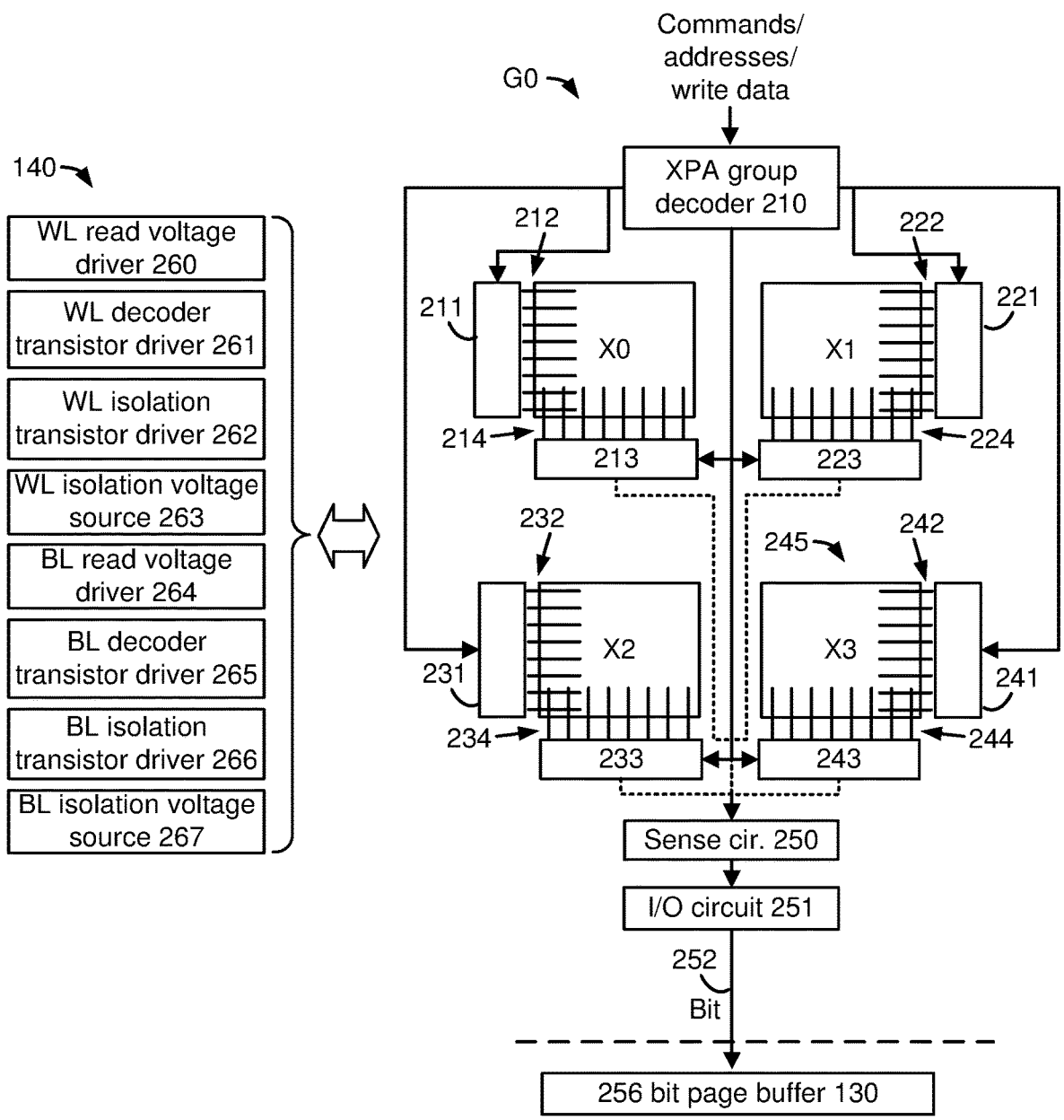

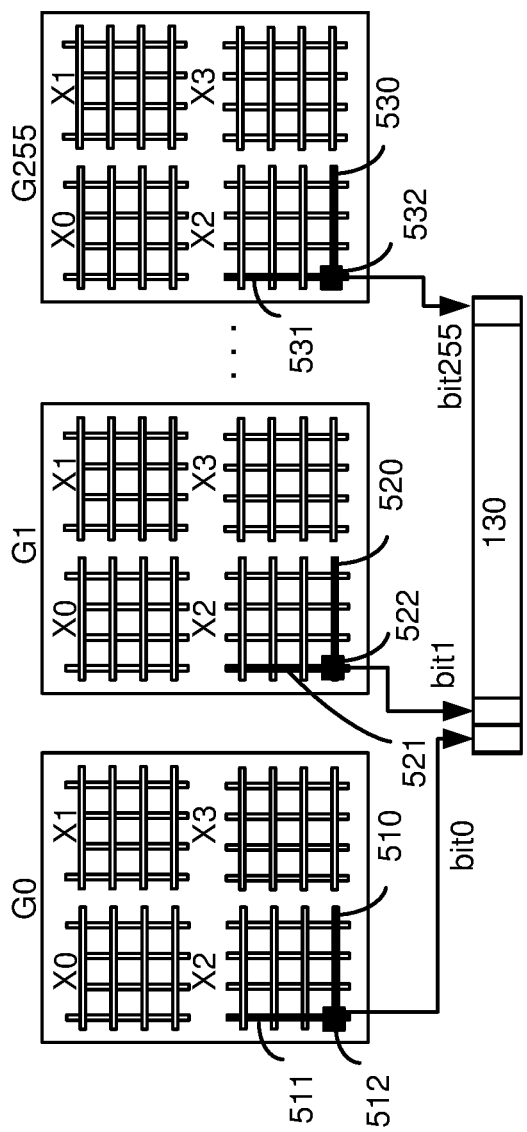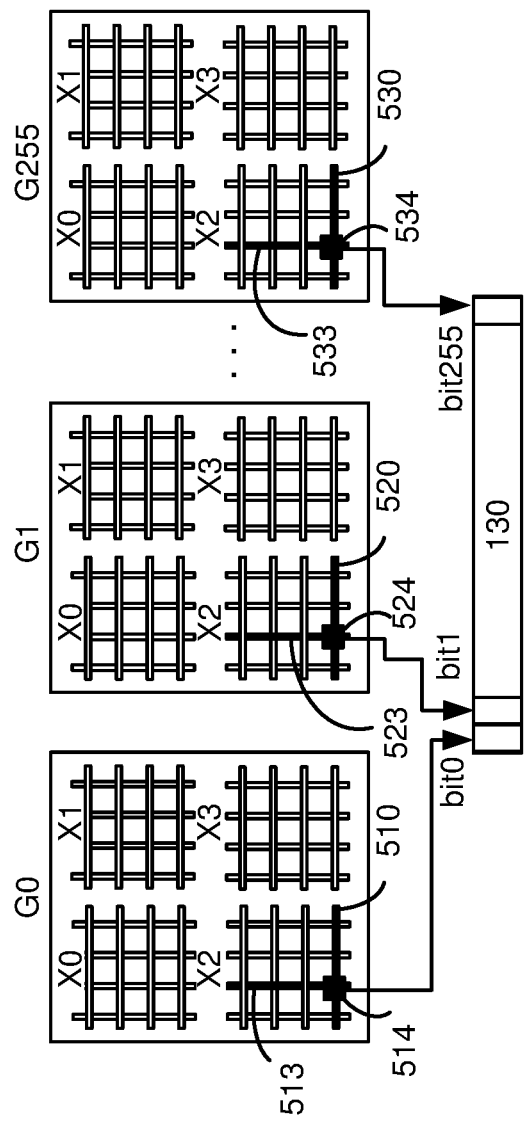

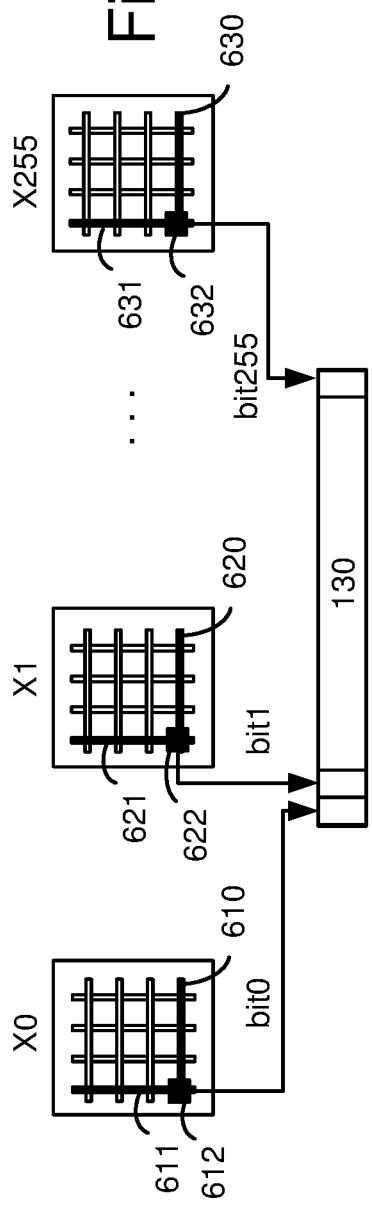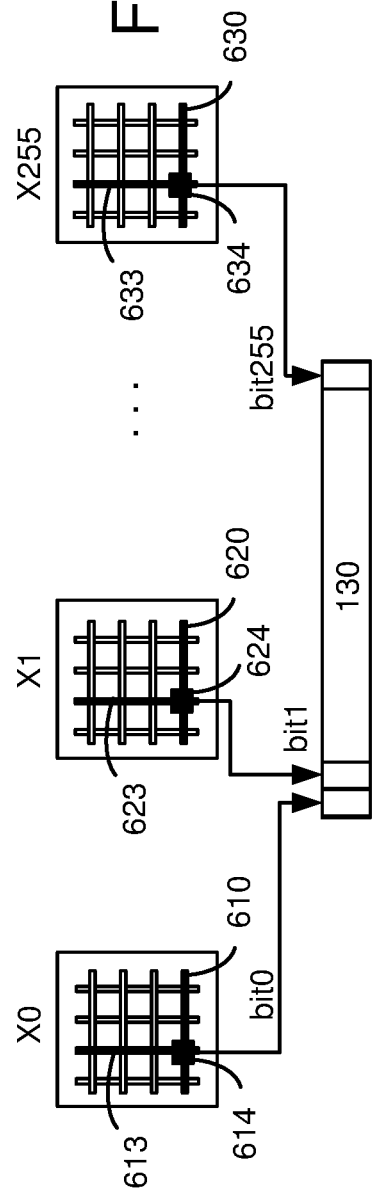

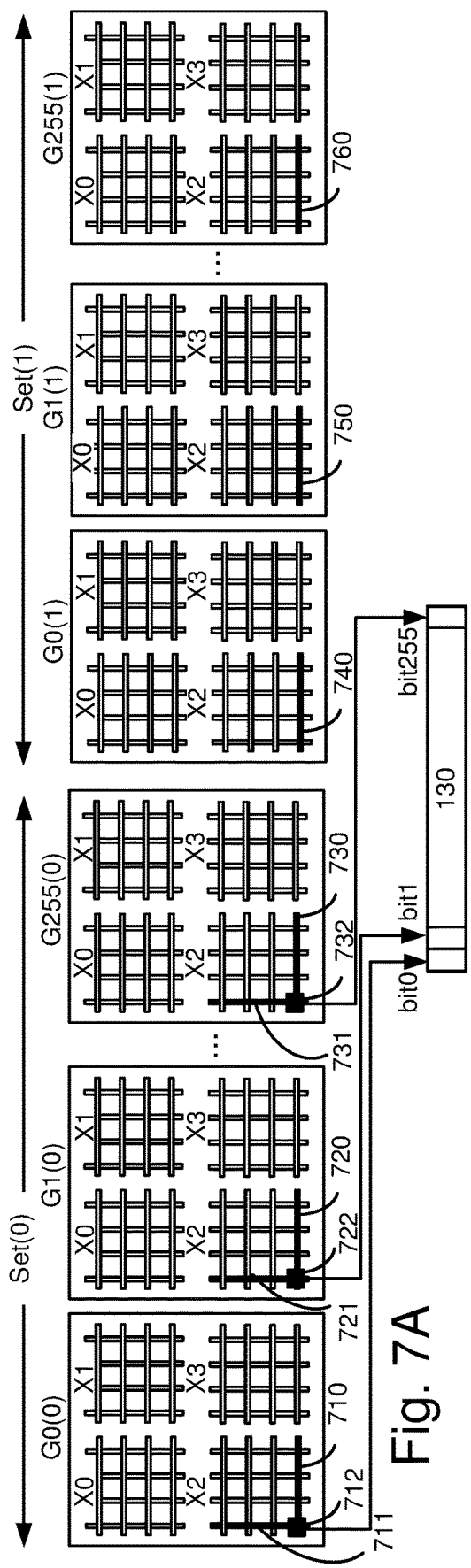
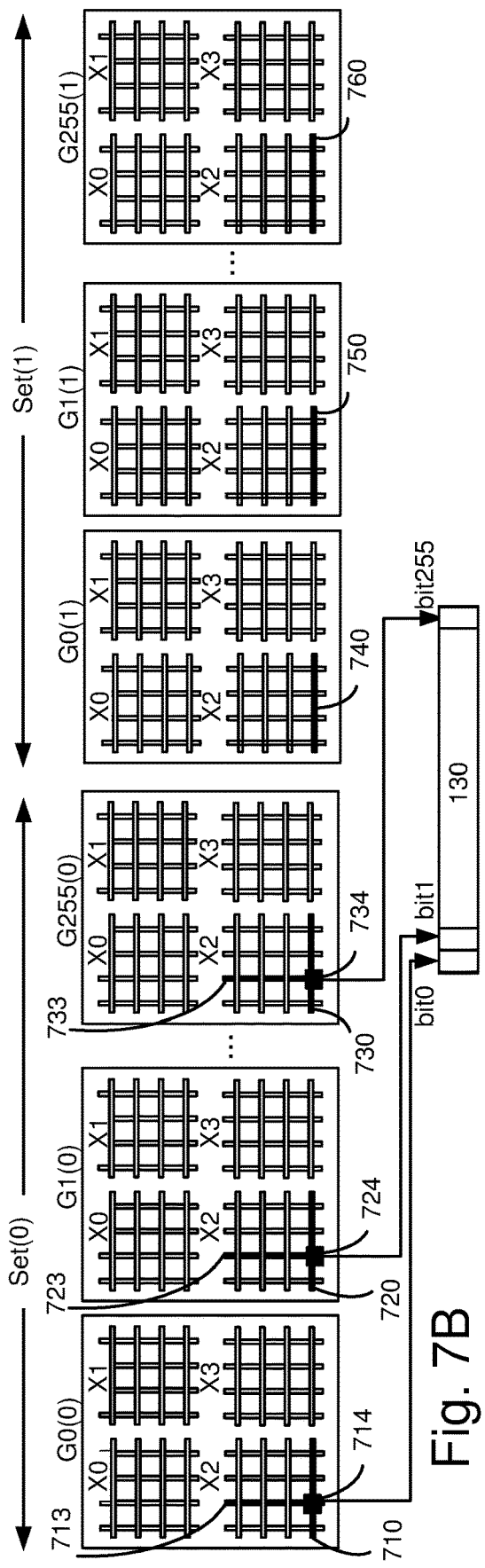
Fig. 7A
Fig. 7B

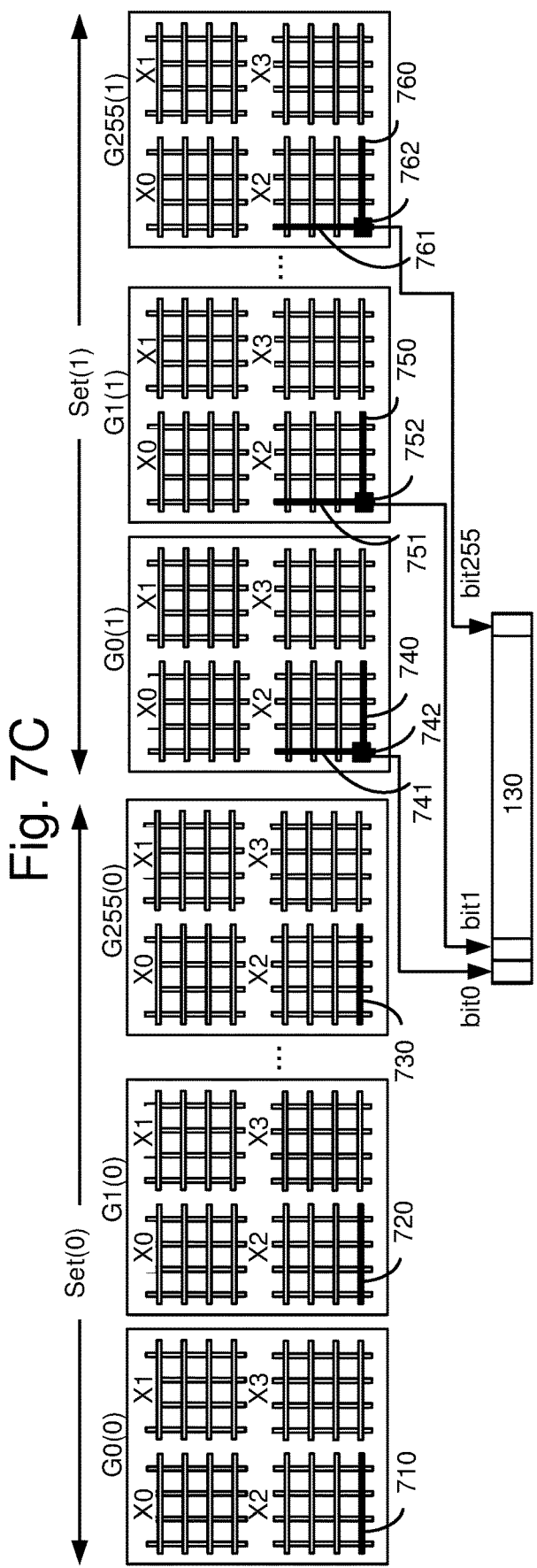

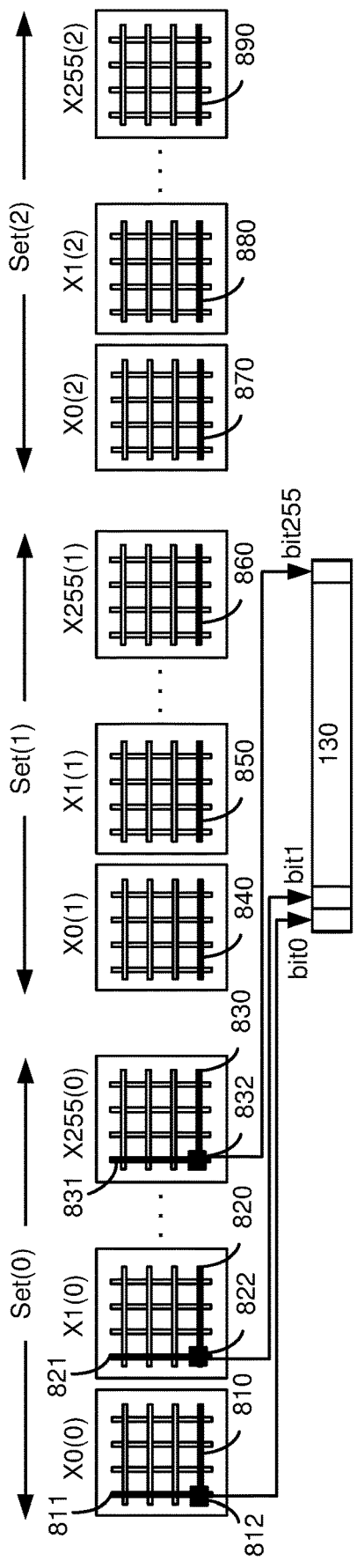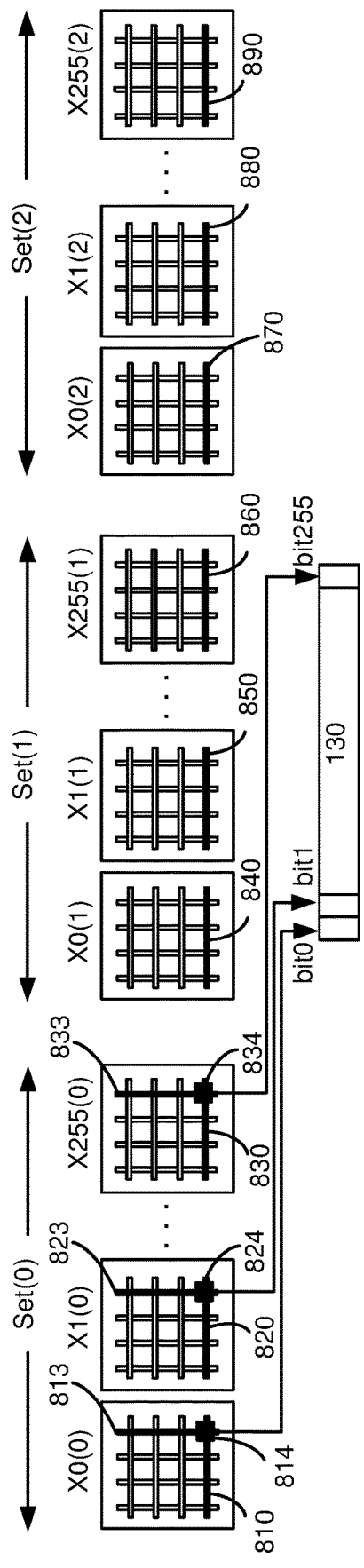

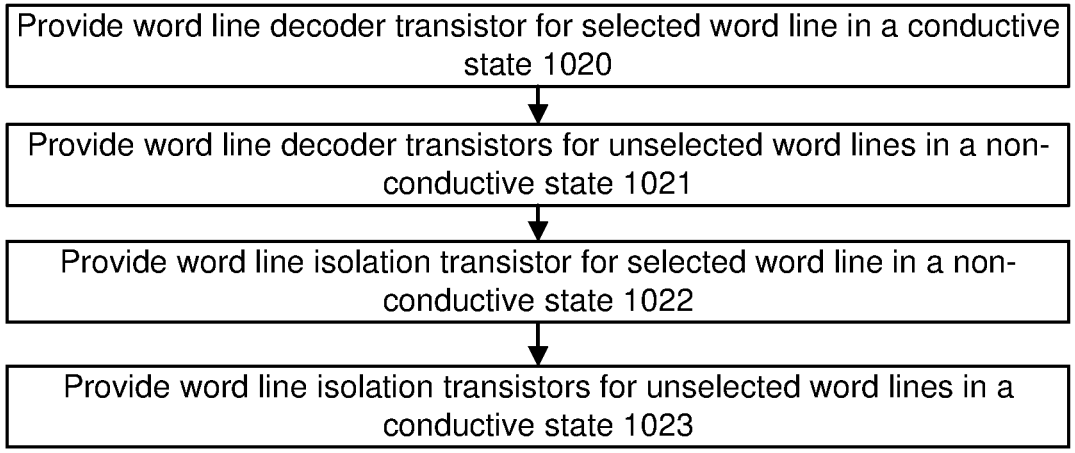
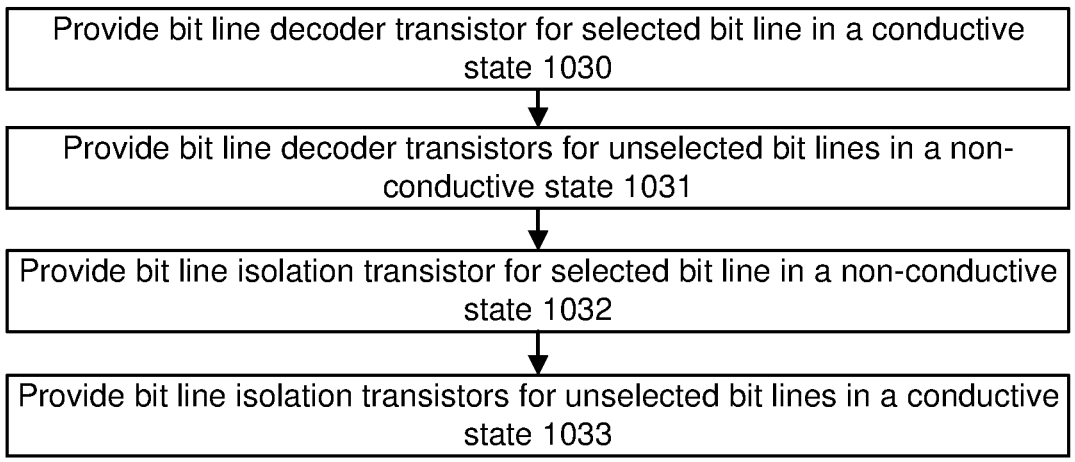

Fig. 11A
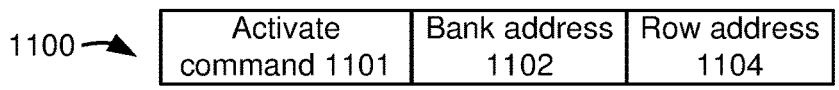
1100 → | Activate command 1101 | Bank address 1102 | Row address 1104 |
Fig. 11B
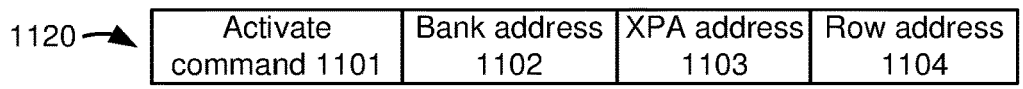
1120 → | Activate command 1101 | Bank address 1102 | XPA address 1103 | Row address 1104 |
Fig. 11C
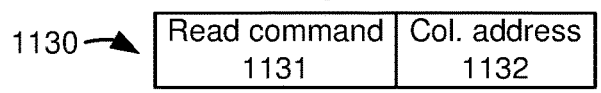
1130 → | Read command 1131 | Col. address 1132 |
Fig. 11D
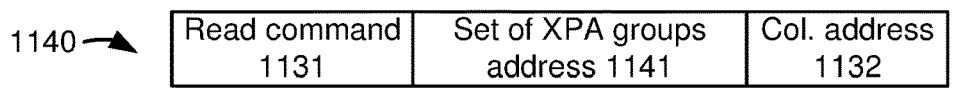
1140 → | Read command 1131 | Set of XPA groups address 1141 | Col. address 1132 |
Fig. 11E
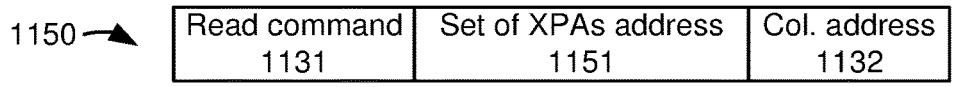
1150 → | Read command 1131 | Set of XPAs address 1151 | Col. address 1132 |
Fig. 12
(1) XPAs grouped; not in sets
FIG. 1A, 5A, 5B, 9A, 11B, 11C
(2) XPAs not grouped; not in sets
FIG. 1C, 6A, 6B, 9B, 11A, 11C
(3) XPAs grouped; in sets
FIG. 1D, 7A-7C, 10A, 11B, 11D
(4) XPAs not grouped; in sets
FIG. 1E, 8A, 8B, 10B, 11A, 11E

CROSSPOINT MEMORY ARCHITECTURE FOR HIGH BANDWIDTH OPERATION WITH SMALL PAGE BUFFER

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

The memory devices can include memory cells arranged in crosspoint arrays, where each memory cell is at the intersection of a bit line and a word line. However, various challenges are presented in operating such memory devices.

BRIEF DESCRIPTION OF THE DRAWINGS

FIG. 1D depicts another configuration of the Bank0 of FIG. 1A, where the groups of crosspoint arrays of memory cells are arranged in sets, Set(0), Set(1) . . . Set(M−1).

FIG. 2A is a block diagram of an example configuration of the crosspoint array group G0 and the voltage drivers and sources 140 of FIG. 1A.

FIG. 5A depicts reading of an example first selected memory cell in crosspoint array X2 of groups G0, G1 . . . G255 of Bank0 in FIG. 1A.

FIG. 5B depicts reading of an example second selected memory cell in the crosspoint array X2 of groups G0, G1 . . . G255 of Bank of FIG. 1A, after the reading of FIG. 5A.

FIG. 6A depicts reading of an example first selected memory cell in crosspoint arrays X0, X1 . . . X255 of Bank of FIG. 1C.

FIG. 6B depicts reading of an example second selected memory cell in the crosspoint arrays X0, X1 . . . X255 of Bank of FIG. 1C, after the reading of FIG. 6A.

FIG. 7A depicts reading of an example first selected memory cell in crosspoint array X2 of groups G0(0), G1(0) . . . G255(0) of Set(0) of Bank0 in FIG. 1D.

FIG. 7B depicts reading of an example second selected memory cell in the crosspoint array X2 of groups G0(0), G1(0) . . . G255(0) of Set(0) of Bank0 in FIG. 1D, after the reading of FIG. 7A.

FIG. 7C depicts reading of an example additional selected memory cell in the crosspoint array X2 of groups G0(1), G1(1) . . . G255(1) of Set(1) of Bank0 in FIG. 1D, after the reading of FIG. 7B.

FIG. 8A depicts reading of an example first selected memory cell in crosspoint arrays X0(0), X1(0) . . . X255(0) of Set(0) of Bank0 in FIG. 1E.

FIG. 8B depicts reading of an example second selected memory cell in the crosspoint arrays X0(0), X1(0) . . . X255(0) of Set(0) of Bank0 in FIG. 1E, after the reading of FIG. 8A.

FIG. 10C depicts a flowchart of an example process for performing step 902 of FIG. 9A, 902a of FIG. 9B, 1002 of FIG. 10A and 1002a of FIG. 10B.

FIG. 10D depicts a flowchart of an example process for performing step 904 of FIG. 9A, 904a of FIG. 9B, 1004 of FIG. 10A and 1004a of FIG. 10B.

FIG. 11A depicts a sequence 1100 including a command and addresses provided by the controller to select a row, consistent with cases (2) and (4) of FIG. 12.

FIG. 11B depicts a sequence 1110 including a command and addresses provided by the controller to select rows of memory cells, consistent with cases (1) and (3) of FIG. 12.

FIG. 11C depicts a sequence 1120 including a command and an address provided by the controller to perform a read operation and to select a column, consistent with cases (1) and (2) of FIG. 12.

FIG. 11D depicts a sequence 1130 including a command and addresses provided by the controller to perform a read operation and to select a set of XPA groups and a column, consistent with case (3) of FIG. 12.

FIG. 11E depicts a sequence 1140 including a command and addresses provided by the controller to perform a read operation and to select a set of XPAs and a column, consistent with case (4) of FIG. 12.

FIG. 12 depicts example cases for the crosspoint arrays (XPAs) regarding the use of groups and sets, with a cross-reference to the figures.

DETAILED DESCRIPTION

Apparatuses and techniques are described for reading crosspoint arrays of memory cells with high bandwidth and a relatively small page buffer.

A crosspoint array (XPA) comprises memory cells arranged in a grid, at the intersection of word lines and bit lines. See, e.g., FIG. 3. For instance, the memory cells can be phase change memory (PCM) cells, also referred to as resistance change memory cells or resistive random access memory (RRAM) cells. Phase change memory cells include a phase change material which can be set in different phases or states which have different resistance levels. The state is maintained when no power is supplied so that the memory cells are non-volatile. Phase change materials include chalcogenides, carbon polymers, perovskites, and certain metal oxides (MeOx) and metal nitrides (MeN). PCM cells typically store one bit of data.

The state of the memory cell can be changed by applying a current which heats the memory cell. Subsequently, a read operation can be performed to determine the data state stored in the memory cell.

However, the bandwidth in reading an array is relatively low since one memory cell at a time is read.

Techniques provided herein address the above and other issues. In one approach, multiple XPAs are read in parallel, with one memory cell per XPA being read at a time. To reduce the time used in a read operation, a row can be selected for the XPAs, after which memory cells in different columns are read, one column at a time, while the same row is selected. This avoids having to transmit commands and a row address for re-selecting the row in each successive read operation.

Figure 1A:
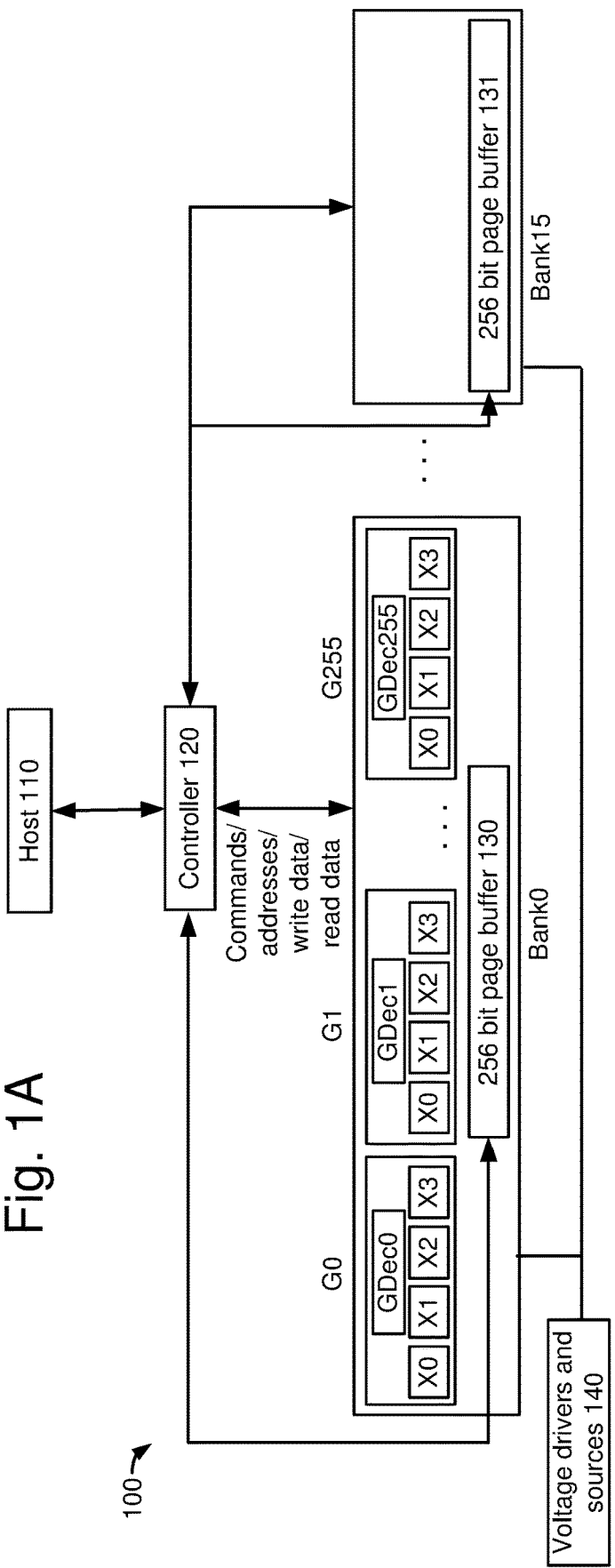
FIG. 1A is a block diagram of an example storage device which includes groups of crosspoint arrays of memory cells in different banks, Bank0 . . . Bank15.
Figure 1C:
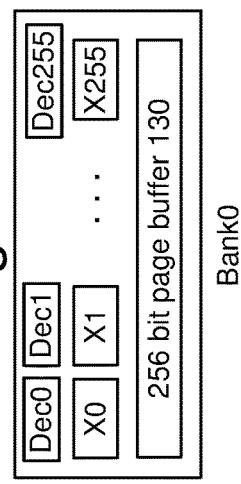
FIG. 1C depicts another configuration of the Bank0 of FIG. 1A, where the crosspoint arrays of memory cells are ungrouped and individually accessible.
Figure 1B:
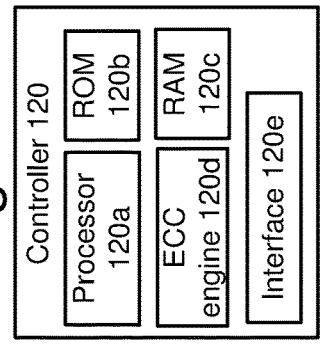
FIG. 1B is a block diagram of an example configuration of the controller 120 of FIG. 1A.
Figure 1E:
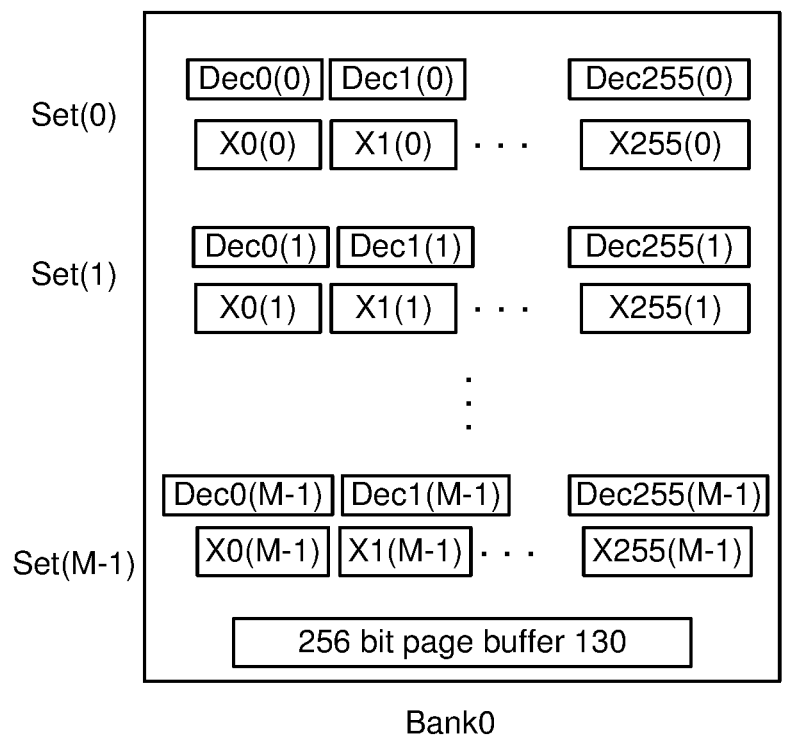
FIG. 1E depicts another configuration of the Bank0 of FIG. 1A, where the crosspoint arrays of memory cells are ungrouped, individually accessible and arranged in sets, Set(0), Set(1) . . . Set(M−1).

The XPAs may be arranged individually, such as in FIGS. 1C and 1E, or one XPA may be accessible at a time in a group, such as in FIGS. 1A and 1D. In one option, the XPAs are arranged in sets, either individually or in groups. A row in each set is selected, after which read operations are performed one set at a time. See the sets of XPA groups in FIG. 1D and the sets of individual XPAs in FIG. 1E. Read operations may overlap, at least in part, for different sets, to reduce overall read time.

Additionally, the read operations allow a controller to issue commands to the XPAs consistent with a standard such as the JEDEC DDR5 which is used for DRAM memory devices.

These and other features are discussed further below.

FIG. 1A is a block diagram of an example storage device which includes groups of crosspoint arrays (XPAs) of memory cells in different banks, Bank0 . . . Bank15. Each bank may be configured with the same number of groups and memory cells, in one approach. The details of Bank0 are depicted. Bank0 includes 256 groups, groups G0, G1 . . . G255. Each group includes four XPAs, for instance, labelled as X0-X3. The groups are connected to a 256 bit page buffer 130 to input and output data to a controller 120. Generally, an XPA group, or group of XPAs, can include multiple XPAs. One advantage of using a group is to increase the number of XPAs which can access a page buffer. Within a group, one XPA can be selected at a time for a read operation. The XPAs of a group may share a common XPA group decoder 210, sense circuit 250 and I/O circuit 251 (FIG. 2A).

The groups of Bank15 are connected to a respective 256 bit page buffer 131 to input and output data to the controller 120. One page buffer per bank may be provided, for example.

Each group includes a group decoder, e.g., GDec0, GDec1 . . . GDec255 for groups G0, G1 . . . G255, respectively. See the group decoder 210 in FIG. 2A. The controller is connected to each group decoder to provide commands and addresses for selecting a XPA, and selecting a word line and a bit line for the selected XPA. GDec0 is an example of a first group decoder, and GDec1 is an example of a second group decoder.

The controller 120 can provide commands and addresses and write data (in a program operation) to each bank, and receive read data (in a read operation) from the page buffer of each bank. The addresses can include row and column addresses which select memory cells in the XPAs. The addresses can also include an XPA address which selects an XPA in a group, and/or a set address which selects a set of XPA groups or a set of XPAs. In one approach, the controller reads the page buffers, one bank at a time over a 256 bit width bus. The controller therefore receives 256 bits at a time, for example. Using a relatively small page buffer helps reduce power consumption.

The use of 256 groups and a 256 bit buffer is an example only. The page buffer size is relatively small, and holds a small percentage, e.g., <1%, of data from the memory cells connected to one word line. For example, each XPA may by 1 kB×1 kB, with 1 kB of word lines and 1 kB of bit lines. In this case, 1 kB of memory cells are connected to each word line. In contrast, a XPA in a DRAM has a page buffer which holds all of the data from the memory cells connected to one word line, since the read process involves transferring all of the data in parallel from the memory cells connected to one word line to the page buffer.

The controller may be connected to a host 110 to receive commands for programming and reading. See also FIG. 1B.

Voltage drivers and sources 140 may be shared among the banks to provide voltages and currents for program and read operations. See also FIG. 2A.

FIG. 1B is a block diagram of an example configuration of the controller 120 of FIG. 1A. The controller may be external to a die on which the banks of memory cells are formed, in one approach. The controller 120 (which in one embodiment is an electrical circuit) may comprise a processor 120a, and memory such as ROM 120b and RAM 120c.

The RAM can be a DRAM, for instance, and may store one or more word lines of data. In a program operation, a copy of data to be programmed is received from the host and stored temporarily in the RAM until the programming is successfully completed in the the memory device. In a read operation, a copy of data to be read may be stored temporarily in the RAM before being output to the host.

An error-correction code (ECC) engine 120d can be used to correct a number of read errors. A memory interface 120e, in communication with ROM 120b, RAM 120c and processor 120a, is an electrical circuit that provides an electrical interface between the controller and the banks of memory cells in one or more memory die. The processor can issue commands to the groups or XPAs via the memory interface.

The memory in the controller 120 may comprise code such as a set of instructions, and the processor is operable to execute the set of instructions to provide the functionality described herein. Alternatively or additionally, the processor can access code from a reserved portion of the banks.

For example, code can be used by the controller to access the banks such as for program and read operations. The code can include boot code and control code (e.g., a set of instructions). The boot code is software that initializes the controller during a booting or startup process and enables the controller to access the banks. The code can be used by the controller to control one or more banks. Upon being powered up, the processor 120a fetches the boot code from the ROM 120b or the reserved portion of the banks for execution, and the boot code initializes the system components and loads the control code into the RAM 120c. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below.

In one embodiment, the host is a computing device (e.g., laptop, desktop, smartphone, tablet, digital camera) that includes one or more processors, one or more processor readable memory devices (RAM, ROM, flash memory, hard disk drive, solid-state memory) that store processor readable code (e.g., software) for programming the one or more processors to perform the methods described herein. The host may also include additional system memory, one or more input/output interfaces and/or one or more input/output devices in communication with the one or more processors.

FIG. 1C depicts another configuration of the Bank0 of FIG. 1A, where the crosspoint arrays of memory cells are ungrouped and individually accessible. In this case, the XPAs are not arranged in groups, where one XPA in a group can be selected at a given time to be read. Instead, each of the 256 XPAs, X0, X1 . . . X255 can be selected to be read in parallel, e.g., concurrently. This configuration is simpler than the configuration of FIG. 1A, and avoids the controller issuing an address which selects an XPA in a group, such as the XPA address 1103 in FIG. 11B. However, the number of XPAs in the group for a given page buffer size is reduced. The page buffer 130 is shared by the XPAs in the bank.

Each XPA includes a decoder, e.g., Dec0, Dec1 . . . Dec255 for X0, X1 . . . X255, respectively. See the decoder 210a in FIG. 2B. The controller is connected to each decoder to provide commands and addresses for selecting a word line and a bit line. Dec0 is an example of a first decoder, and Dec1 is an example of a second decoder.

FIG. 1D depicts another configuration of the Bank0 of FIG. 1A, where the groups of crosspoint arrays of memory cells are arranged in sets, Set(0), Set(1) . . . Set(M-1). This approach extends the configuration of FIG. 1A to provide multiple sets of XPA groups. Each set comprises multiple groups. For example, a number M>1 sets are provided, including Set(0), Set(1) . . . Set(M-1). The page buffer 130 is shared by the sets in the bank. This approach allows a larger number of XPA groups to share a common page buffer.

Each group includes a group decoder, e.g., GDec0(0), GDec1(0) . . . GDec255(0) for groups G0(0), G1(0) . . . G255(0), respectively, GDec0(1), GDec1(1) . . . GDec255 (1) for groups G0(1), G1(1) . . . G255(1), respectively, and GDec0(M-1), GDec1(M-1) . . . GDec255(M-1) for groups G0(M-1), G1(M-1) . . . G255(M-1), respectively. GDec0 (0) is an example of a first group decoder, and GDec1(0) is an example of a second group decoder. Set(0) provides an example of a first set of crosspoint array groups in a bank, and Set(1) provides an example of a second set of crosspoint array groups in a bank.

FIG. 1E depicts another configuration of the Bank0 of FIG. 1A, where the crosspoint arrays of memory cells are ungrouped, individually accessible and arranged in sets, Set(0), Set(1) . . . Set(M-1). This approach extends the configuration of FIG. 1C to provide multiple sets of XPAs. Each set comprise multiple XPAs. For example, a number M>1 sets are provided, including Set(0), Set(1) . . . Set(M-1). A buffer such as the page buffer 130 is shared by the sets in the bank. This approach allows a larger number of XPAs to share a common page buffer. Also, overlapping read operations can be performed in different sets.

Each XPA includes a decoder, e.g., Dec0(0), Dec1(0) . . . Dec255(0) for X0(0), X1(0) . . . X255(0), respectively, Dec0(1), Dec1(1) . . . Dec255(1) for X0(1), X1(1) . . . X255(1), respectively, and Dec0(M-1), Dec1(M-1) . . . Dec255(M-1) for X0(M-1), X1(M-1) . . . X255(M-1), respectively. Set(0) provides an example of a first set of crosspoint array groups in a bank, and Set(1) provides an example of a second set of crosspoint array groups in a bank.

FIG. 2A is a block diagram of an example configuration of the crosspoint array group G0 and the voltage drivers and sources 140 of FIG. 1A. The group includes four XPAs, X0-X3. Each XPA has an associated row decoder and column decoder in this example. For example, X0 has a row decoder 211 connected to word lines 212 and a column decoder 213 connected to bit lines 214. X1 has a row decoder 221 connected to word lines 222 and a column decoder 223 connected to bit lines 224. X2 has a row decoder 231 connected to word lines 232 and a column decoder 233 connected to bit lines 234. X3 has a row decoder 241 connected to word lines 242 and a column decoder 243 connected to bit lines 244. In another possible configuration, a row decoder is located between, and shared by, two adjacent XPAs. Also, a column decoder can be located between, and shared by, two adjacent XPAs.

An XPA group decoder 210 is provided for each group, and receives commands and addresses from the controller 120. As discussed, e.g., in connection with FIG. 4A, the addresses can initially include a XPA address which select one of the XPAs in the group, and a row address which selects a word line in the selected XPAs. Subsequently, a read command can be received with a column address which selects a bit line in the selected XPAs. A selected memory cell to be read in a selected XPA is thereby defined at the intersection of the selected word line and the selected bit line. The XPA group decoder 210 can receive commands and addresses such as in FIG. 11A-11E.

The XPA group decoder can send control signals to a row decoder and a column decoder in a selected XPA. The column decoders are connected to a sense circuit 250. For a selected memory cell in a selected XPA, the associated control circuitry allows the sense circuit to read the data state of the memory cell in a read operation. The sense circuit, in turn, is connected to an input/output (I/O) circuit 251 to output the data, such as a bit of data, to the page buffer 130 on a path 252. The dashed line represents a boundary between the group G0 and the page buffer.

The group G0 is connected to the voltage drivers and sources 140 to perform a read operation, for example. The voltage drivers and sources can include a WL read voltage driver 260, a WL decoder transistor driver 261, a WL isolation transistor driver 262, a WL isolation voltage source 263, BL read voltage driver 264, a BL decoder transistor driver 265, a BL isolation transistor driver 266 and a BL isolation voltage source 267. In addition to the WL and BL read voltage drivers, WL and BL program voltage drivers can similarly be provided for a program operation. The voltage drivers and sources are discussed further in connection with FIG. 3.

A crosspoint array (XPA) can include an array of non-volatile memory cells arranged in a grid at the intersection of word lines and bit lines. The word lines typically extend orthogonally to the bit lines. The memory cells are accessible one memory cell at a time for program or read operations. One example of memory cells which can be used in a crosspoint array is PCM memory cells. The XPAs can be arranged side by side in a 2D configuration and/or stacked in a 3D configuration.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

The circuit 245 includes the XPA X3, the column decoder 243 and the row decoder 241. If X3 is a selected XPA in the group, the column decoder 243 is a selected column decoder and the row decoder 241 is a selected row decoder.

Figure 2B:
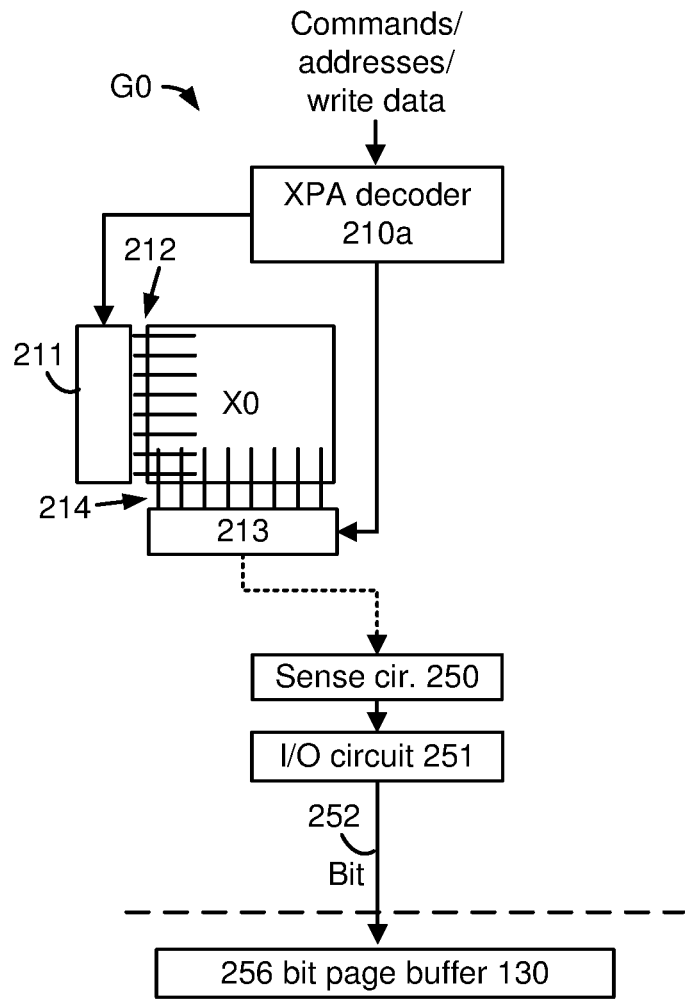
FIG. 2B is a block diagram of an example configuration of the crosspoint array X0 of FIG. 1C.

FIG. 2B is a block diagram of an example configuration of the crosspoint array X0 of FIG. 1C. Some of the components of FIG. 2A are repeated as indicated by the repeated reference numbers. A primary difference is that an XPA decoder 210a is provided to configure the row decoder 211 and column decoder 213 of X0 alone. For example, the XPA decoder 210a can select a memory cell in X0 by selecting a row and column. The XPA decoder 210a can receive commands and addresses such as in FIG. 11A-11E.

Figure 2C:
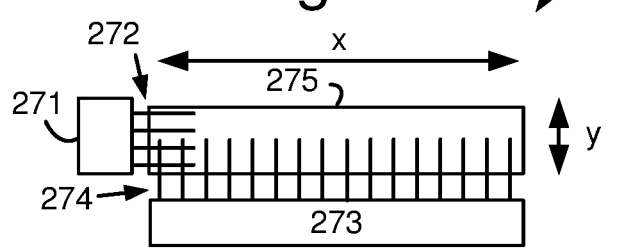
FIG. 2C depicts an example rectangular configuration of the crosspoint arrays of FIGS. 1A and 1C-1E in a circuit 270.

FIG. 2C depicts an example rectangular configuration of the crosspoint arrays of FIGS. 1A and 1C-1E in a circuit 270. An XPA may have a square configuration, where the number of rows of memory cells and the number of word lines equals the number of columns of memory cells and the number of bits lines. For example, as mentioned, a XPA may by 1 kB×1 kB, with 1 kB of word lines and 1 kB of memory cells connected to each word line. However, the time required to perform a read operation is a function of the bit line length and the number of rows in an XPA. This is due to factors such as RC delays in providing a read voltage on the bit lines. By reducing the bit line length and the number of rows, the read time can be decreased.

This configuration may help meet the timing guidelines of the DRAM standard, JEDEC. JEDEC specifies various timing guidelines, including the time periods tRCD and tRL. In the techniques disclosed herein, tRCD is used to deliver an activate command and a bank, XPA and row address from the controller to the XPA or XPA group decoder. tRCD may be less than 15 nsec., for example. tRL is used to deliver a read command and a column address. tRL also includes a delay of the memory cell, sense circuits, ECC circuits, column decoder logic and input/ouput circuitry. tRL may be less than 30 nsec., for example. The non-square configuration can reduce the delays under tRL since voltage signals can propagate more quickly on the bit lines.

Further, to maintain the same storage capacity of the XPA, the number of columns of memory cells can be increased. In this example, the circuit 270 includes an XPA 275, a row decoder 271 connected to word lines 272, and a column decoder 273 connected to bit lines 274. The height y of the XPA may be less than the width x so that the XPA has a rectangular and non-square configuration. For example, the number of columns can be doubled while the number of rows is halved, to maintain a given storage capacity. x=2y in one approach. The XPA may have 500 B (bytes) of rows and 2 kB (kilobytes) of columns to maintain a capacity of 1 kB×1 kB or 1 MB (megabyte).

Figure 3:
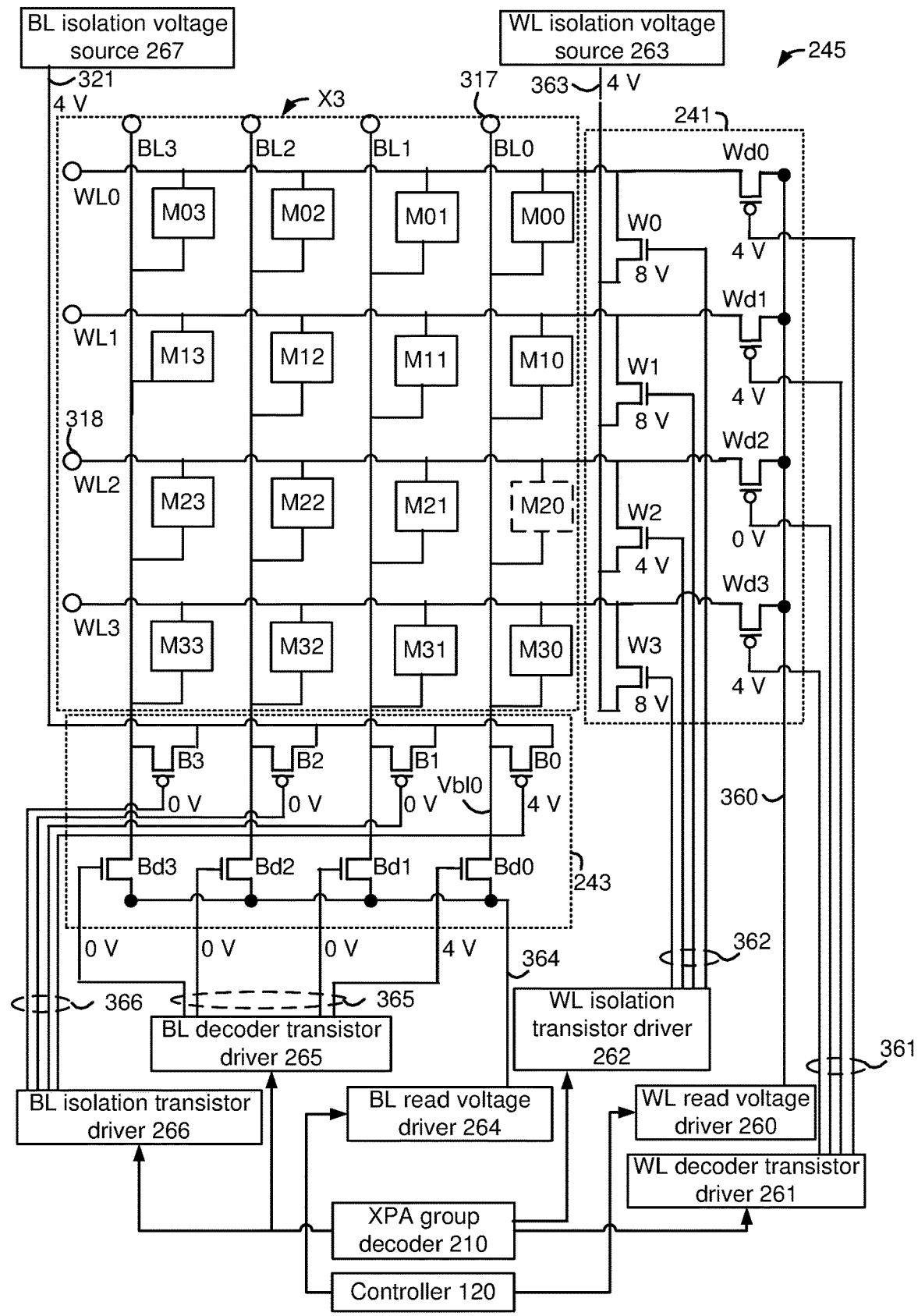
FIG. 3 depicts an example configuration of the circuit 245 of FIG. 2A, including the crosspoint array X3, the column decoder 243, the row decoder 241, and the voltage drivers and sources 140 of FIG. 1A.

FIG. 3 depicts an example configuration of the circuit 245 of FIG. 2A, including the XPA X3, the column decoder 243, the row decoder 241, and the voltage drivers and sources 140 of FIG. 1A. In a simplified example, the XPA includes sixteen example memory cells arranged in four rows and four columns, where each row is connected to a respective word line WL0-WL3 and each column is connected to a respective bit line BL0-BL3. Each memory cell may be a two-terminal device in which one terminal is connected to a first control line (e.g., word line) and another terminal is connected to a second control line (e.g., bit line). The control lines may be metal or doped silicon, for instance.

For example, in the XPA X3, memory cells M00, M01, M02 and M03 are connected to WL0 and to bit lines B0, B1, B2 and B3, respectively, memory cells M10, M11, M12 and M13 are connected to WL1 and to bit lines B0, B1, B2 and B3, respectively, memory cells M20, M21, M22 and M23 are connected to WL2 and to bit lines B0, B1, B2 and B3, respectively, and memory cells M30, M31, M32 and M33 are connected to WL3 and to bit lines B0, B1, B2 and B3, respectively. M20, connected to WL2 and BL0, is an example selected memory cell as denoted by the dashed line. A selected memory cell is at the intersection of a selected bit line or column and a selected word line or row.

Each bit line and word line can be terminated by an open circuit as depicted by the circular terminals including example terminals 317 and 318 for BL0 and WL2, respectively, in one approach.

In one approach, the unselected memory cells which are connected to both unselected word lines and unselected bit lines can be biased at both of their terminals with an equal positive voltage (an isolation voltage) during a read operation to prevent the unselected memory cells from being read. An unselected memory cell is a memory cell which is not selected for a read or write operation. A selected memory cell is a memory cell which is selected for a read or write operation. Some of the unselected memory cells (e.g., M21-M23) will be connected to a selected word line (WL2) and an unselected bit line (BL1-BL3), while other unselected memory cells (M00, M10, M30) are connected to an unselected word line (WL0, WL1, WL3) and a selected bit line (BL0).

The selected memory cell in the XPA, which is connected to the selected word line and the selected bit line, can be biased with different voltages across its terminals during a read operation to generate a current which can be read by a sense circuit. The level of the current is a function of the data state of the memory cell. In some cases, a bit of data is stored in a memory cell.

Access to the word lines is controlled by word line decoder transistors and word line isolation transistors.

Word line decoder transistors Wd0-Wd3 such as p-channel MOSFETs are connected serially to WL0-WL3, respectively, to select or unselect the respective word line. The word line decoder transistors are connected between the memory cells and the WL read voltage driver 260. With the example selected memory cell M20, the decoder transistor Wd2 is selected, or provided in a conductive state, by applying a low control gate voltage such as 0 V from the WL decoder transistor driver 261. In this case, Wd2 allows the read voltage from the WL read voltage driver to reach WL2. In contrast, at the same time, the word line decoder transistors Wd0, Wd1 and Wd3 are unselected, or provided in a non-conductive state, by applying a higher control gate voltage such as 4 V from the WL decoder transistor driver 261. In this case, Wd0, Wd1 and Wd3 prevent the read voltage from reaching WL0, WL1 and WL3, respectively. The sources of the WL decoder transistors Wd0-Wd3 can be connected to one another via a path 360.

Each word line WL0-WL3 is also connected in parallel to a word line isolation transistor W0-W3, respectively, which can be provided in a conductive state to pass an isolation voltage, e.g., 4 V on the path 363, to unselected word lines from the WL isolation voltage source 263. These transistors may be n-channel MOSFETs, in one approach, and have a source connected to a common voltage on a path 363. For the selected word line, WL2, W2 is provided in a non-conductive state to disconnect the isolation voltage from the word line. For the unselected word lines, WL0, WL1 and WL3, W0, W1 and W3 are provided in a conductive state to connect the isolation voltage to the respective word line.

Access to the bit lines is controlled by bit line decoder transistors and bit line isolation transistors.

Bit line decoder transistors Bd0-Bd3 such as n-channel MOSFETs are connected serially to BL0-BL3, respectively, to select or unselect the respective bit line. The bit line decoder transistors are connected between the memory cells and the BL read voltage driver 264. During a read operation, the selected bit line can be connected to the bit line read voltage driver 264 via the path 364 by providing the respective decoder transistor in a conductive state. For example, BL0 can be connected to the voltage driver 264 by providing Bd0 in a conductive state, e.g., by applying 4 V to its control gate. BL1-BL3 can be disconnected from the voltage driver 264 by providing Bd1-Bd3 in a non-conductive state, e.g., by applying 0 V to their control gates. The drains of Bd0-Bd3 can be connected to one another via a path 364.

Bit line isolation transistors B0-B3, which may be p-channel MOSFETs, are connected to the bit lines BL0-BL3, respectively, to pass an isolation or unselect voltage to the bit lines or disconnect the isolation voltage from the bit line. For a selected bit line such as BL0, the respective isolation transistor B0 is provided in a non-conductive state by providing a high voltage such as 4 V on the control gate. This prevents the isolation voltage on the path 321 from reaching BL0. For the unselected bit lines such as BL1-BL3, the respective isolation transistors B1-B3 are provided in a conductive state by providing a low voltage such as 0 V on their control gates. This connects the isolation voltage on the path 321 to BL1-BL3, respectively, and to unselected memory cells connected to those bit lines.

The circuit 245 is connected to the voltage drivers and sources 140 of FIG. 2A. For example, the WL read voltage driver 260 can provide a read voltage on a path 360 which is connected to each of the WL decoder transistors. The WL decoder transistor driver 261 can provide separate voltage signals to the WL decoder transistors via paths 361. The WL isolation transistor driver 262 can provide separate voltage signals to the WL isolation transistors via paths 362. The WL isolation voltage source 263 can provide an isolation voltage such as 4 V to the WL isolation voltage transistors via a path 363.

The BL read voltage driver 264 can provide a read voltage on a path 364 which is connected to each of the BL decoder transistors. The BL decoder transistor driver 265 can provide separate voltage signals to the BL decoder transistors via paths 365. The BL isolation transistor driver 266 can provide separate voltage signals to the BL isolation transistors via paths 366. The BL isolation voltage source 267 can provide an isolation voltage such as 4 V to the BL isolation voltage transistors via a path 321.

In addition to the WL and BL read voltage drivers, WL and BL program voltage drivers can similarly be provided for a program operation.

For each selected crosspoint array in each group in a first set of crosspoint array groups, a row decoder and a column decoder are connected to the first group decoder 210, word lines are connected to the row decoder and non-volatile memory cells of the selected crosspoint array, and bit lines are connected to the column decoder and the non-volatile memory cells of the selected crosspoint array. Further, the word lines comprise a selected word line connected to a first selected memory cell and the bit lines comprise a selected bit line connected to the first selected memory cell.

Figure 4A:
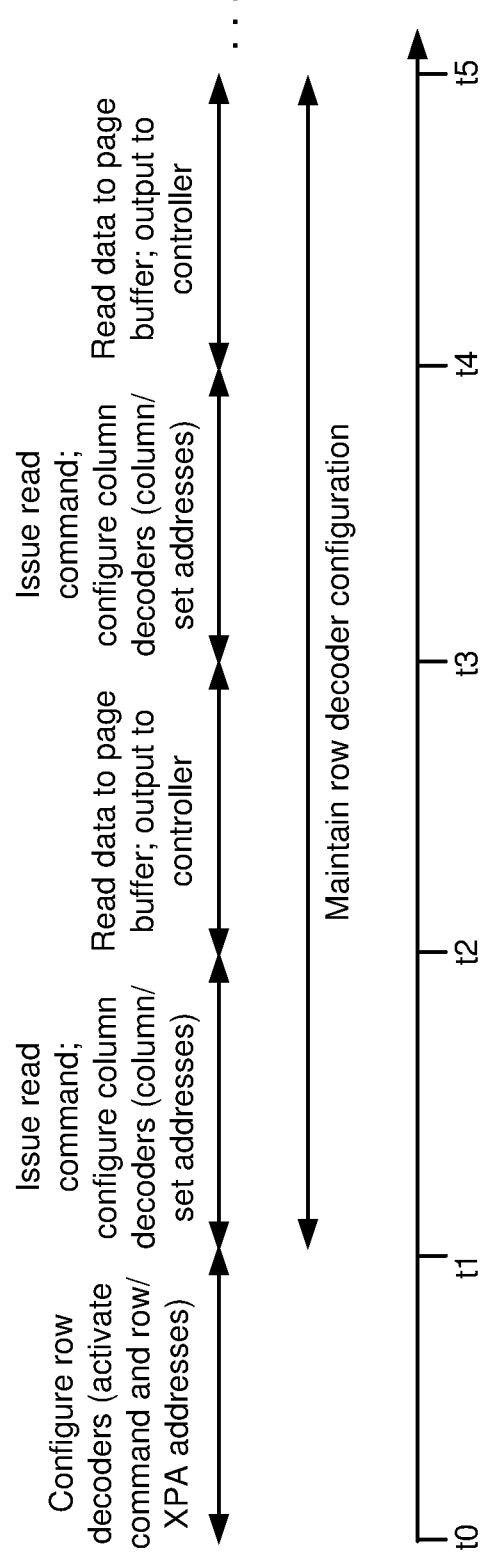
FIG. 4A depicts an example timeline of a read operation involving a bank of memory cells consistent with cases (1)-(4) of FIG. 12.

FIG. 4A depicts an example timeline of a read operation involving a bank of memory cells consistent with cases (1)-(4) of FIG. 12. The timeline includes one instance of configuring row decoders, and multiple instances of issuing a read command, configuring column decoders, reading data to a page buffer, and outputting data to a controller from the page buffer. The configuring of the row decoders at t0-t1 can involve the controller 120 issuing an activate command and a row address to one or more selected banks of memory cells. The row address selects a row or word line in selected row decoders. The controller can also issue a XPA address to the one or more selected banks to identify a selected XPA in a group of XPAs, consistent with FIG. 1A. The XPA group decoder 210 is responsive to the XPA address to select a row of the selected XPA in the group, but not in the unselected XPAs.

The time period t1-t3 denotes a first read operation. In the time period t1-t2, the controller issues a read command and configures column decoders. The configuring of the column decoders can involve the controller issuing a first column address to one or more selected banks. The first column address selects a first column or bit line in column decoders of the one or more selected banks. The controller can also issue a set address to the one or more selected banks to identify a selected set of XPA groups, consistent with FIG. 1D, or a selected set of XPAs, consistent with FIG. 1E. The XPA group decoder 210 is responsive to the set address to select a column of the selected set, but not in the unselected sets.

Each selected bank includes multiple, e.g., 256, selected XPAs of memory cells. For each selected XPA, the row address and first column address identify a first selected memory cell which is to be read. In the time period t2-t3, sense circuits read data from the first selected memory cells and store the data in a page buffer for each selected bank. The data can be subsequently output to the controller. The controller can issue commands to the page buffer to read all of the data in the buffer at once, e.g., in parallel, or to read successive portions of the data, one portion at a time.

The time period t3-t5 denotes a second read operation. The time period t3-t4 is similar to t1-t2 but involves the controller issuing a second column address to the one or more selected banks. The second column address selects a second column or bit line in column decoders of the one or more selected banks. A set address can also be provided which is the same as, or different than, the previous set address. A set address at t1-t2 can be a first set address and a set address at t3-t4 can be a second set address.

For each selected XPA, the row address and column address identify a second selected memory cell which is to be read. In the time period t4-t5, sense circuits read data from the second selected memory cells and store the data in a page buffer for each selected bank. The data can be subsequently output to the controller. The controller can issue commands to the page buffer to read the data in the buffer, as mentioned.

Additional read operations can be performed for memory cells connected to the selected word line without reconfiguring the row decoders. Once the row decoders are configured, e.g., to select a word line, at t0-t1, the row decoders can maintain their configuration from t1-t5 and later.

Figure 4B:
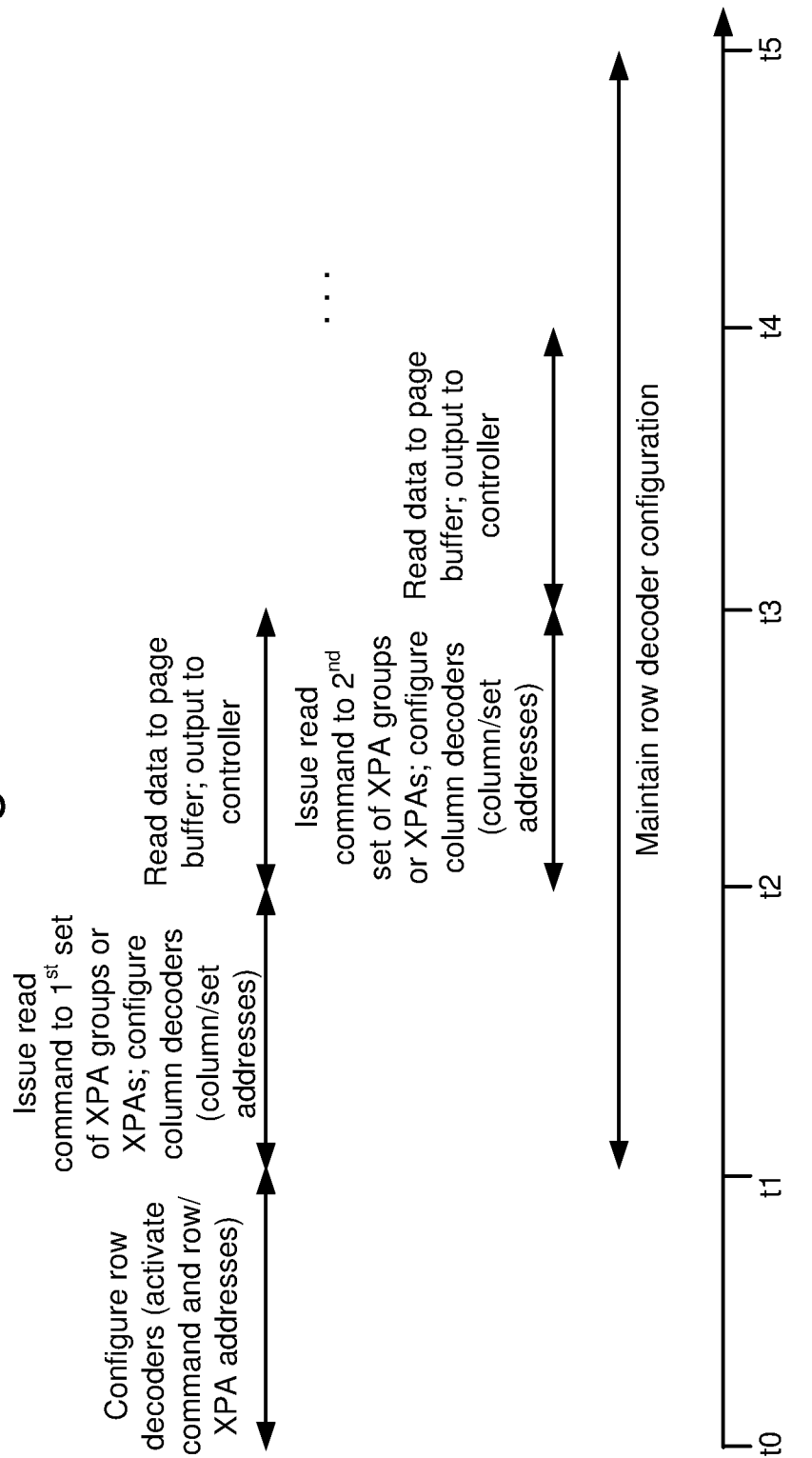
FIG. 4B depicts an example timeline of a read operation involving a bank of memory cells consistent with cases (3) and (4) of FIG. 12.

FIG. 4B depicts an example timeline of a read operation involving a bank of memory cells consistent with cases (3) and (4) of FIG. 12. When different sets of XPAs or XPA groups are used, it is possible for the time periods for the respective read operations to overlap so that the overall read time is reduced. Additionally, the power consumption is limited by limiting the number of overlapping read operations. In this example, the first read operation at t1-t3 overlaps with the second read operation at t2-t4. The overlap between the first and second read operations is at t2-t3 in this simplified example. The overlap could begin before or after t2 in practice. Additional read operations could also be performed in parallel so that more than two read operations overlap. For example, a third read operation at t3-t5 could overlap with the second read operation at t2-t4.

The overlap is possible since the controller 120 can be configured to send command and addresses to the XPA group decoders or XPA decoders while also retrieving read data from the page buffer.

In the time period t1-t2, the controller issues a read command and configures column decoders for a first set of XPA groups or XPAs. The controller issues a set address to the one or more selected banks to identify a selected set of XPA groups, consistent with FIG. 1D, or a selected set of XPAs, consistent with FIG. 1E. In the time period t2-t3, sense circuits read data from the selected memory cells of the first set of XPA groups or XPAs and store the data in a page buffer for each selected bank. In the time period t2-t3, the controller also issues a read command and configures column decoders for a second set of XPA groups or XPAs. The controller issues a set address to the one or more selected banks to identify a selected set of XPA groups, consistent with FIG. 1D, or a selected set of XPAs, consistent with FIG. 1E. In the time period t3-t4, sense circuits read data from the selected memory cells of the second set of XPA groups or XPAs and store the data in a page buffer for each selected bank.

Note that the interval between time periods along the time axis depicted in FIGS. 4A and 4B is a simplified example. The points on the time axis are not necessary equally spaced.

In FIG. 5A-8C, each XPA is depicted in a simplified manner as having four word lines connected to four rows of memory cells and four bit lines connected to four columns of memory cells. A word line is represented by a thin horizontally-extending rectangle, and a bit line is represented by a thin vertically-extending rectangle. Additionally, a selected row or column is denoted by a filled in black rectangle while an unselected row or column is denoted by an open rectangle. A selected memory cell is denoted by a filled in black square at the intersection of a selected word line and a selected bit line. An unselected memory cell is at the intersection of a selected word line and an unselected bit line, or at the intersection of an unselected word line and a selected bit line. Additionally, the page buffer 130 is depicted with bits labelled bit0, bit1 . . . bit255 being read into respective positions within the buffer in a read operation.

FIG. 5A depicts reading of an example first selected memory cell in crosspoint array X2 of groups G0, G1 . . . G255 of Bank0 in FIG. 1A. Each group includes four XPAs, X0-X3, as mentioned. X2 is the selected XPA in each group. In G0, the row 510 is the selected row, and the column 511 is the selected column, thereby identifying the selected memory cell 512 from which a bit, bit0, is provided to the page buffer. In G1, the row 520 is the selected row, and the column 521 is the selected column, thereby identifying the selected memory cell 522 from which a bit, bit1, is provided to the page buffer. In G255, the row 530 is the selected row, and the column 531 is the selected column, thereby identifying the selected memory cell 532 from which a bit, bit255, is provided to the page buffer. A bit can similarly be provided to the buffer from one selected memory cell in each of the remaining groups G2-G254.

In the groups G0-G255, the same XPA, X2, is selected for the read operation. Thus, the selected XPAs are positioned in the same relative location in each of the groups. This location is the lower left of the group. Similarly, within each selected XPA, the same word line and bit line are selected. Thus, the selected memory cells are positioned in the same relative location in each of the selected XPAs. This location is the lower left of the XPA.

Accordingly, within a group of XPAs, a row is activated and selected in a selected XPA.

FIG. 5B depicts reading of an example second selected memory cell in the crosspoint array X2 of groups G0, G1 . . . G255 of Bank of FIG. 1A, after the reading of FIG. 5A. In a series of successive read operation, the selected row is maintained to save the time involved in selecting a new row. Thus, in G0, G1 . . . G255, the selected row is maintained as the row 510, 520 . . . 530. However, the selected column is different so that the selected memory cell is different than in FIG. 5A.

In G0, the column 513 is the selected column, thereby identifying the selected memory cell 514 from which a bit, bit0, is provided to the page buffer. In G1, the column 523 is the selected column, thereby identifying the selected memory cell 524 from which a bit, bit1, is provided to the page buffer. In G255, the column 533 is the selected column, thereby identifying the selected memory cell 534 from which a bit, bit255, is provided to the page buffer.

In FIG. 5A, the first column, at the left side of X2 is selected in a first read operation, and in FIG. 5B, the second column of X2 is selected in a second read operation. However, this is just an example, as any column can be selected in each read operation when the controller provides a column address to the bank.

FIG. 6A depicts reading of an example first selected memory cell in crosspoint arrays X0, X1 . . . X255 of Bank of FIG. 1C. In X0, the row 610 is the selected row, and the column 611 is the selected column, thereby identifying the selected memory cell 612 from which a bit, bit0, is provided to the page buffer 130. In X1, the row 620 is the selected row, and the column 621 is the selected column, thereby identifying the selected memory cell 622 from which a bit, bit1, is provided to the page buffer. In X255, the row 630 is the selected row, and the column 631 is the selected column, thereby identifying the selected memory cell 632 from which a bit, bit255, is provided to the page buffer. A bit can similarly be provided to the buffer from one selected memory cell in each of the remaining XPAs, X2-X254.

FIG. 6B depicts reading of an example second selected memory cell in the crosspoint arrays X0, X1 . . . X255 of Bank of FIG. 1C, after the reading of FIG. 6A. The selected row is maintained as the row 510. In X0, the column 613 is the selected column, thereby identifying the selected memory cell 614 from which a bit, bit0, is provided to the page buffer. In X1, the column 623 is the selected column, thereby identifying the selected memory cell 624 from which a bit, bit1, is provided to the page buffer. In X255, the column 633 is the selected column, thereby identifying the selected memory cell 634 from which a bit, bit255, is provided to the page buffer. As before, while the first and second columns are selected in the first and second read operations of FIGS. 6A and 6B, respectively, any column can be selected in each read operation when the controller provides a column address to the bank.

FIG. 7A depicts reading of an example first selected memory cell in crosspoint array X2 of groups G0(0), G1(0) . . . G255(0) of Set(0) of Bank0 in FIG. 1D. The groups G0(1), G1(1) . . . G255(1) of Set(1) of Bank0 are also depicted. Set(2) to Set(M−1) are not depicted. As mentioned, a read operation can be performed for a set of XPA groups, where multiple sets are provided in a bank. In this example, a XPA and a row are selected in each set of the bank, even though a current read operation involves just one of the sets. For example, X2 is the selected XPA in each group and set. The first row is also selected in each group and set. That is, rows 710, 720 . . . 730 are the selected rows in G0(0), G1(0) . . . G255(0) of Set(0) and rows 740, 750 . . . 760 are the selected rows in G0(1), G1(1) . . . G255(1) of Set(1). The rows can be selected by the controller by providing a row address which selects the row, and a XPA address which selects a XPA in a group, to the XPA group decoder 210. The XPA group decoder interprets the addresses to send control signals to select a row using the row decoder of a selected XPA in the group. This can occur for all sets, both selected and unselected, in one approach.

This first read operation involves Set(0). In G0(0), the column 711 is the selected column, thereby identifying the selected memory cell 712 from which a bit, bit0, is provided to the page buffer. In G1(0), the column 721 is the selected column, thereby identifying the selected memory cell 722 from which a bit, bit1, is provided to the page buffer. In G255(0), the column 731 is the selected column, thereby identifying the selected memory cell 732 from which a bit, bit255, is provided to the page buffer. The columns can be selected by the controller by providing a column address which selects the column and a set address which selects Set(0), to the XPA group decoder 210. The XPA group decoder interprets the addresses to send control signals to select a column using the column decoder of a selected XPA in a selected group. The XPA group decoder may be configured with a set identifier to know whether it is selected based on the received set address. If an XPA decoder is not selected, it does not select a column in an XPA, in one approach.

FIG. 7B depicts reading of an example second selected memory cell in the crosspoint array X2 of groups G0(0), G1(0) . . . G255(0) of Set(0) of Bank0 in FIG. 1D, after the reading of FIG. 7A. The same row continues to be selected in each group. However, a new column in the same set, Set(0), is selected.

This second read operation involves Set(0). In G0(0), the column 713 is the selected column, thereby identifying the selected memory cell 714 from which a bit, bit0, is provided to the page buffer. In G1(0), the column 723 is the selected column, thereby identifying the selected memory cell 724 from which a bit, bit1, is provided to the page buffer. In G255(0), the column 733 is the selected column, thereby identifying the selected memory cell 734 from which a bit, bit255, is provided to the page buffer. The columns can be selected by the controller by providing a column address which selects the column and a set address which selects Set(0) to the XPA group decoder.

FIG. 7C depicts reading of an example additional selected memory cell in the crosspoint array X2 of groups G0(1), G1(1) . . . G255(1) of Set(1) of Bank0 in FIG. 1D, after the reading of FIG. 7B. The same row continues to be selected in each group. However, a new column in a new set, Set(1), is selected.

This third read operation involves Set(1). In G0(1), the column 741 is the selected column, thereby identifying the selected memory cell 742 from which a bit, bit0, is provided to the page buffer. In G1(1), the column 751 is the selected column, thereby identifying the selected memory cell 752 from which a bit, bit1, is provided to the page buffer. In G255(1), the column 761 is the selected column, thereby identifying the selected memory cell 762 from which a bit, bit255, is provided to the page buffer. The columns can be selected by the controller by providing a column address which selects the column and a set address which selects Set(1) to the XPA group decoder.

Generally, the read operations for multiple sets can occur in any order. For example, read operations may occur in one set and then proceed to another set. In another approach, the read operations jump back and forth between different sets.

In FIG. 7A, the columns 711, 721 and 731 are selected by a first column address and represent first selected bit lines in a first read operation which is performed in response to a first read command. In FIG. 7B, the columns 713, 723 and 733 are selected by a second column address and represent second selected bit lines in a second read operation which is performed in response to a second read command. In FIG. 7C, the columns 741, 751 and 761 are selected by an additional column address and represent additional selected bit lines in an additional read operation which is performed in response to an additional read command.

FIG. 7A-7C provide an example of reading groups in different sets, one set at a time. The sets can be selected in any order when the controller provides a set address to the bank. This approach can reduce read time by performing many read operations across different sets of memory cells while maintaining the selection of a row and therefore saving time by avoiding the selecting of a new row. Further, the page buffer and associated I/O circuitry can be kept relatively small since they can be sized for one set of memory cells.

In FIG. 7A-7C, Set(0) provides an example of a first set of crosspoint array groups in a bank, where the memory cells 712, 722 and 732 are first selected memory cells. Set(1) provides an example of a second set of crosspoint array groups in a bank, where the memory cells 742, 752 and 762 are second selected memory cells.

FIG. 8A depicts reading of an example first selected memory cell in crosspoint arrays X0(0), X1(0) . . . X255(0) of Set(0) of Bank0 in FIG. 1E. The XPAs X0(1), X1(1) . . . X255(1) of Set(1) of Bank0, and the XPAs X0(2), X1(2) . . . X255(2) of Set(2) of Bank0 are also depicted. Set(3) to Set(M−1) are not depicted.

In this example, a row is selected in each set of the bank, even though a current read operation involves just one of the sets. For example, the first row is selected in each group and set. That is, rows 810, 820 . . . 830 are the selected rows in X0(0), X1(0) . . . X255(0) of Set(0), rows 840, 850 . . . 860 are the selected rows in X0(1), X1(1) . . . X255(1) of Set(1), and rows 870, 880 . . . 890 are the selected rows in X0(2), X1(2) . . . X255(2) of Set(2). The rows can be selected by the controller by providing a row address which selects the row to the XPA decoder 210*a*.

This first read operation involves Set(0). In X0(0), the column 811 is the selected column, thereby identifying the selected memory cell 812 from which a bit, bit0, is provided to the page buffer. In X1(0), the column 821 is the selected column, thereby identifying the selected memory cell 822 from which a bit, bit1, is provided to the page buffer. In X255(0), the column 831 is the selected column, thereby identifying the selected memory cell 832 from which a bit, bit255, is provided to the page buffer. The columns can be selected by the controller by providing a column address which selects the column and a set address which selects the Set(0) to the XPA decoder 210*a*.

FIG. 8B depicts reading of an example second selected memory cell in the crosspoint arrays X0(0), X1(0) . . . X255(0) of Set(0) of Bank0 in FIG. 1E, after the reading of FIG. 8A. The row selection is maintained. This second read operation also involves Set(0). In X0(0), the column 813 is the selected column, thereby identifying the selected memory cell 814 from which a bit, bit0, is provided to the page buffer. In X1(0), the column 823 is the selected column, thereby identifying the selected memory cell 824 from which a bit, bit1, is provided to the page buffer. In X255(0), the column 833 is the selected column, thereby identifying the selected memory cell 834 from which a bit, bit255, is provided to the page buffer. The columns can be selected by the controller by providing a column address which selects the column and a set address which selects Set(0).

Figure 8C:
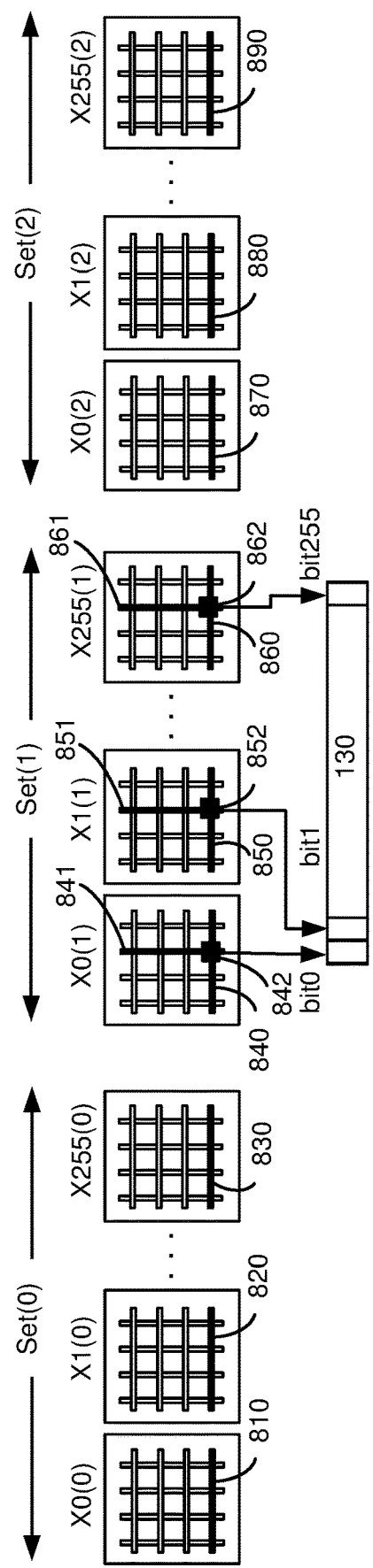
FIG. 8C depicts reading of an example additional selected memory cell in crosspoint arrays X0(1), X1(1) . . . X255(1) of Set(1) of Bank0 in FIG. 1E, after the reading of FIG. 8B.

FIG. 8C depicts reading of an example additional selected memory cell in crosspoint arrays X0(1), X1(1) . . . X255(1) of Set(1) of Bank0 in FIG. 1E, after the reading of FIG. 8B. The row selection is maintained. This third read operation involves Set(1). In X0(1), the column 841 is the selected column, thereby identifying the selected memory cell 842 from which a bit, bit0, is provided to the page buffer. In X1(1), the column 851 is the selected column, thereby identifying the selected memory cell 852 from which a bit, bit1, is provided to the page buffer. In X255(1), the column 861 is the selected column, thereby identifying the selected memory cell 862 from which a bit, bit255, is provided to the page buffer. The columns can be selected by the controller by providing a column address which selects the column and a set address which selects Set(1) to the XPA decoder 210*a*.

The third set, Set(2), is not read in the examples of FIG. 8A-8C. It is possible to have a set in a bank in which a word line is selected but no read operation occurs, while a read operation does occur for another set in the bank.

Figure 9A:
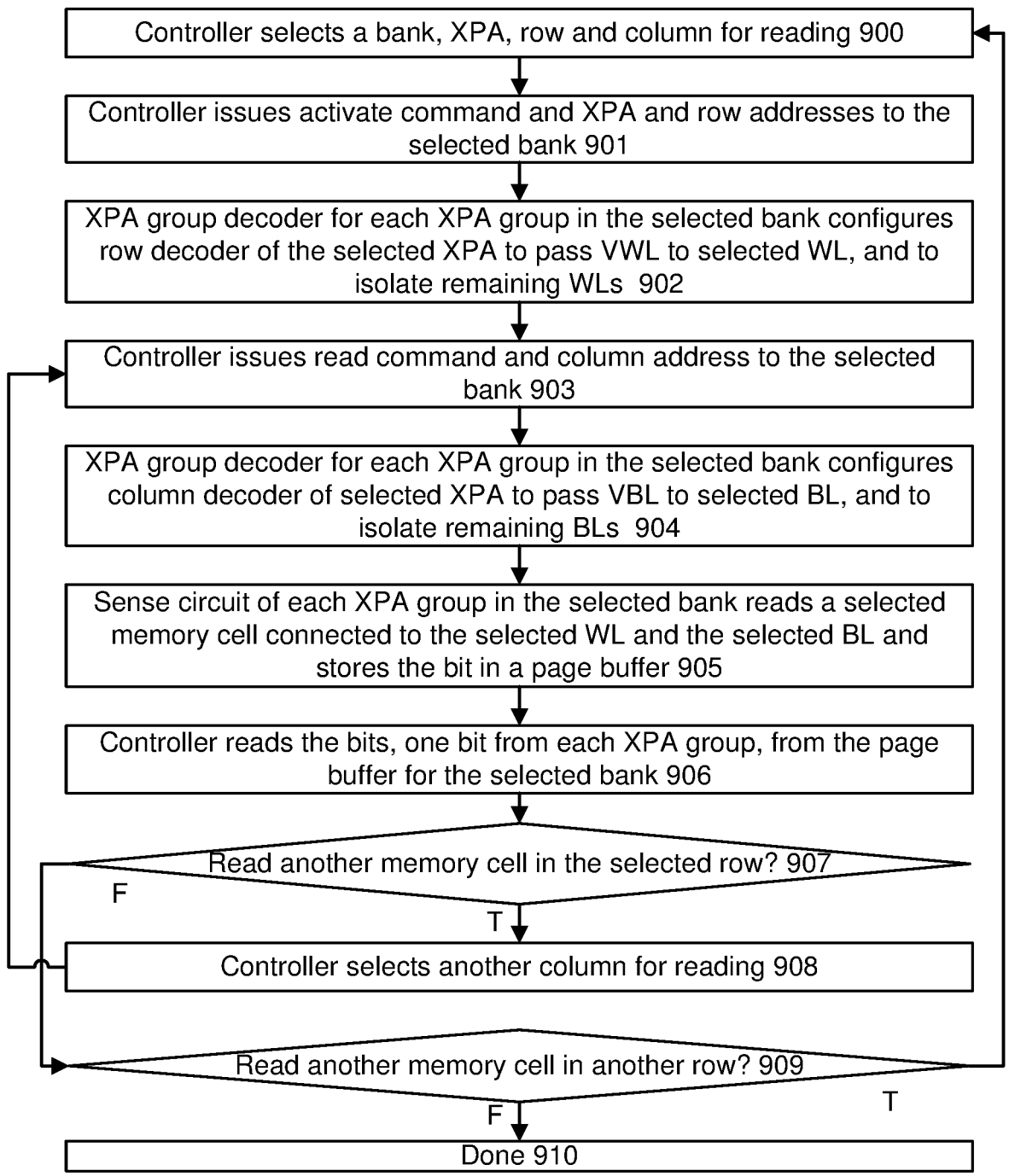
FIG. 9A depicts a flowchart of an example process for reading memory cells in crosspoint array groups, consistent with case (1) of FIG. 12.

FIG. 9A depicts a flowchart of an example process for reading memory cells in crosspoint array groups, consistent with case (1) of FIG. 12. At step 900, the controller selects a bank, crosspoint array (XPA), row and column for reading. This can be in response to a read command received from a host, for example. This step may be performed internally within the controller before sending related commands and addresses to the banks of memory cells, e.g., at the XPA group decoders. At step 901, the controller issues an activate command and XPA and row addresses to the selected bank. The activate command informs the selected bank that a row address is being provided and that a row decoder should be configured to select a corresponding word line. The activate command can be analogous to that used in the DRAM standard, JEDEC DDR5.

At step 902, the XPA group decoder 210 for each XPA group in the selected bank configures a row decoder of the selected XPA to pass a word line read voltage, VWL, to the selected word line (WL), and to isolate the remaining WLs. For example, the XPA group decoder may configure the word line decoder transistors and isolation transistors, as discussed in connection with FIG. 2A. At step 903, the controller issues a read command and a column address to the selected bank, e.g., at the XPA group decoders. At step 904, in response, the XPA group decoder for each XPA group in the selected bank configures the column decoder of the selected XPA to pass a bit line read voltage, VBL, to a selected bit line (BL), and to isolate the remaining BLs. At step 905, the sense circuit of each XPA group in the selected bank reads a selected memory cell connected to the selected WL and the selected BL and stores the data, e.g., a bit, in a page buffer. At step 906, the controller reads the bits, one bit from each XPA group, from the page buffer for the selected bank.

A decision step 907 determines whether another memory cell in the selected row is to be read. If the decision step 907 is true, the controller selects another column for reading, at step 908 and step 903 is performed. If the decision step 907 is false, a decision step 909 determines whether another memory cell in another row is to be read. If the decision step 909 is false, the read operations are done, at step 910. If the decision step 909 is true, step 900 is repeated, where the controller selects a bank, crosspoint array (XPA), row and column for reading.

Figure 9B:
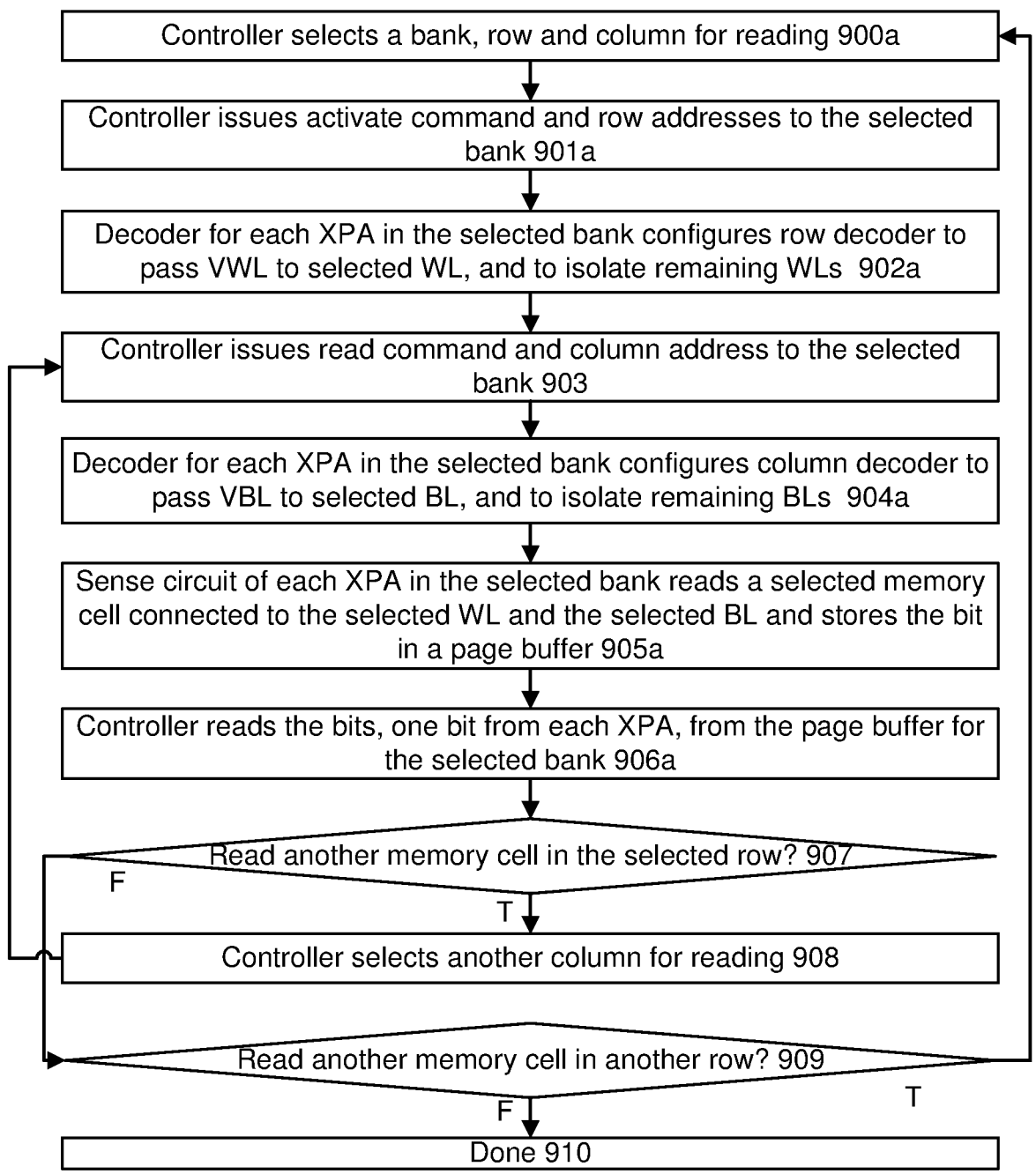
FIG. 9B depicts a flowchart of an example process for reading memory cells in crosspoint arrays, consistent with case (2) of FIG. 12.

FIG. 9B depicts a flowchart of an example process for reading memory cells in crosspoint arrays, consistent with case (2) of FIG. 12. The process includes some repeated steps from FIG. 9A as indicated by the repeated reference numbers 903 and 907-910. Steps 900a-902a and 904a-906a are similar to steps 900-902 and 904-906, respectively, in FIG. 9A.

At step 900a, the controller selects a bank, row and column for reading. The XPA is not selected, in one approach, since all XPAs are involved. At step 901, the controller issues an activate command and row addresses to the selected bank, e.g., at the XPA decoders 210a. The XPA address may be omitted in one approach.

At step 902a, the decoder 210a for each XPA in the selected bank configures a row decoder to pass a word line read voltage, VWL, to the selected word line (WL), and to isolate the remaining WLs. At step 904a, the decoder for each XPA in the selected bank configures the column decoder to pass a bit line read voltage, VBL, to a selected bit line (BL), and to isolate the remaining BLs. At step 905a, the sense circuit of each XPA in the selected bank reads a selected memory cell connected to the selected WL and the selected BL and stores the data, e.g., a bit, in a page buffer. At step 906, the controller reads the bits, one bit from each XPA, from the page buffer for the selected bank.

Figure 10A:
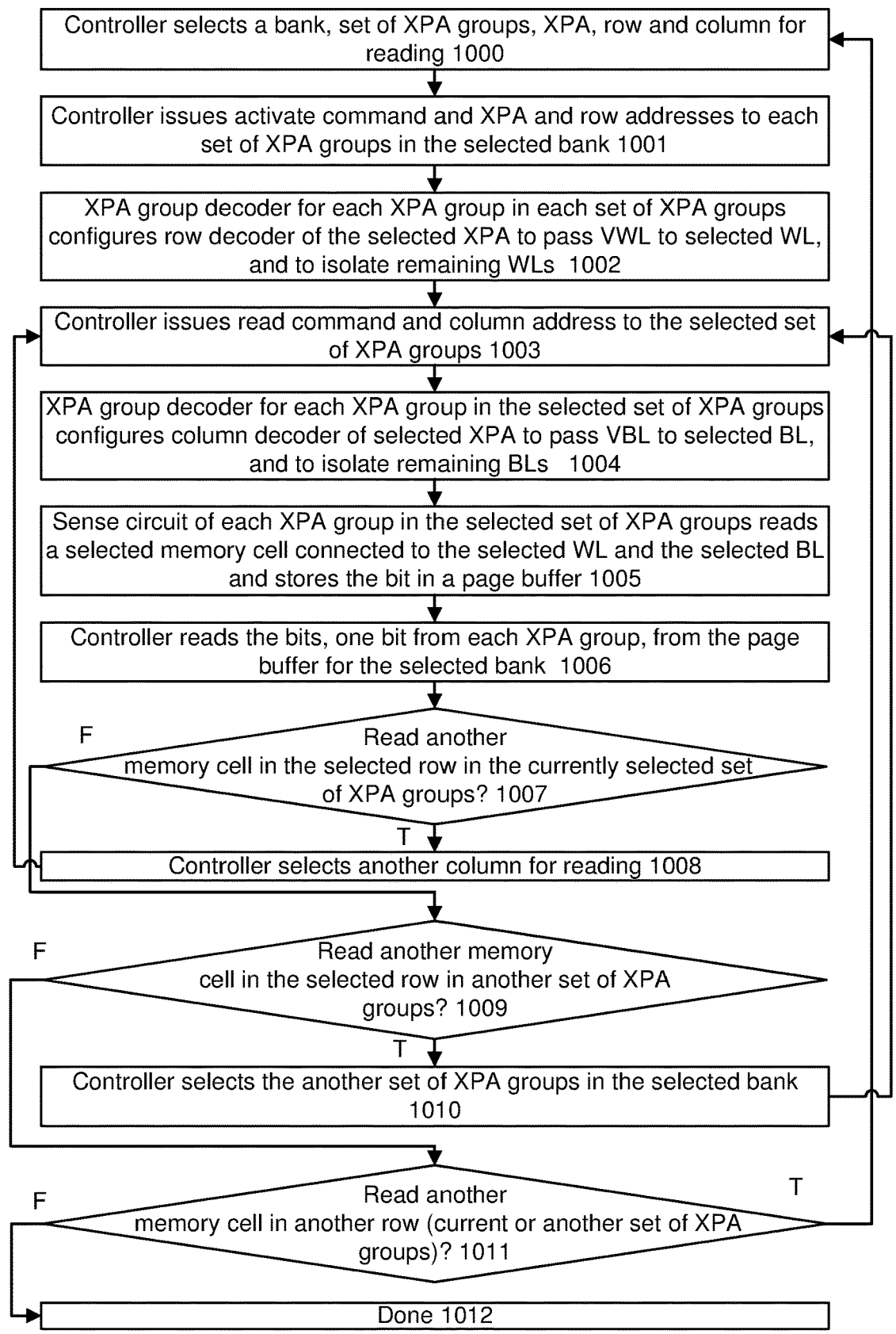
FIG. 10A depicts a flowchart of an example process for reading memory cells in different sets of crosspoint array groups, consistent with case (3) of FIG. 12.

FIG. 10A depicts a flowchart of an example process for reading memory cells in different sets of crosspoint array groups, consistent with case (3) of FIG. 12. At step 1000, the controller selects a bank, set of XPA groups, XPA within each group, and a row and column for reading. This can be in response to a read command received from a host, for example. This step may be performed internally within the controller before sending related commands and addresses to the banks of memory cells. At step 1001, the controller issues an activate command and XPA and row addresses to each set of XPA groups in the selected bank, e.g., at the XPA group decoders.

At step 1002, the XPA group decoder 210 for each XPA group in each set of XPA groups configures a row decoder of the selected XPA to pass VWL to the selected WL, and to isolate the remaining WLs. At step 1003, the controller issues a read command and a column address to the selected set of XPA groups. At step 1004, the XPA group decoder for each XPA group in the selected set of XPA groups configures the column decoder of the selected XPA to pass VBL to a selected BL, and to isolate the remaining BLs. At step 1005, the sense circuit of each XPA group in the selected set of XPA groups reads a selected memory cell connected to the selected WL and the selected BL and stores the data, e.g., a bit, in a page buffer. At step 1006, the controller reads the bits, one bit from each XPA group, from the page buffer for the selected bank.

A decision step 1007 determines whether another memory cell in the selected row in the currently selected set of XPA groups is to be read. If the decision step 1007 is true, the controller selects another column for reading, at step 1008. Step 1003 is then repeated, where the controller issues a read command and a new column address to the current set of XPA groups.

If the decision step 1007 is false, a decision step 1009 determines whether another memory cell in the selected row in another set of XPA groups is to be read. If the decision step 1009 is true, the controller selects the another set of XPA groups in the selected bank at step 1010. Step 1003 is then repeated, where the controller issues a read command and a column address to a new set of XPA groups. If decision step 1009 is false, a decision step 1011 determines whether another memory cell in another row (in the currently selected set of XPA groups or in another set of XPA groups) is to be read. If decision step 1011 is false, the read operations are done, at step 1012. If step 1011 is true, step 1000 is repeated.

Decision steps 1007, 1009 and 1011 represent three different cases of a next read operation. Decision step 1007 determines if the next read operation is in the same row, XPA group and set as the previous read operation. Decision step 1009 determines if the next read operation is in the same row as the previous read operation but in a new set of XPA groups. Decision step 1011 determines if the next read operation is in a different row than the row of the previous read operation.

Figure 10B:
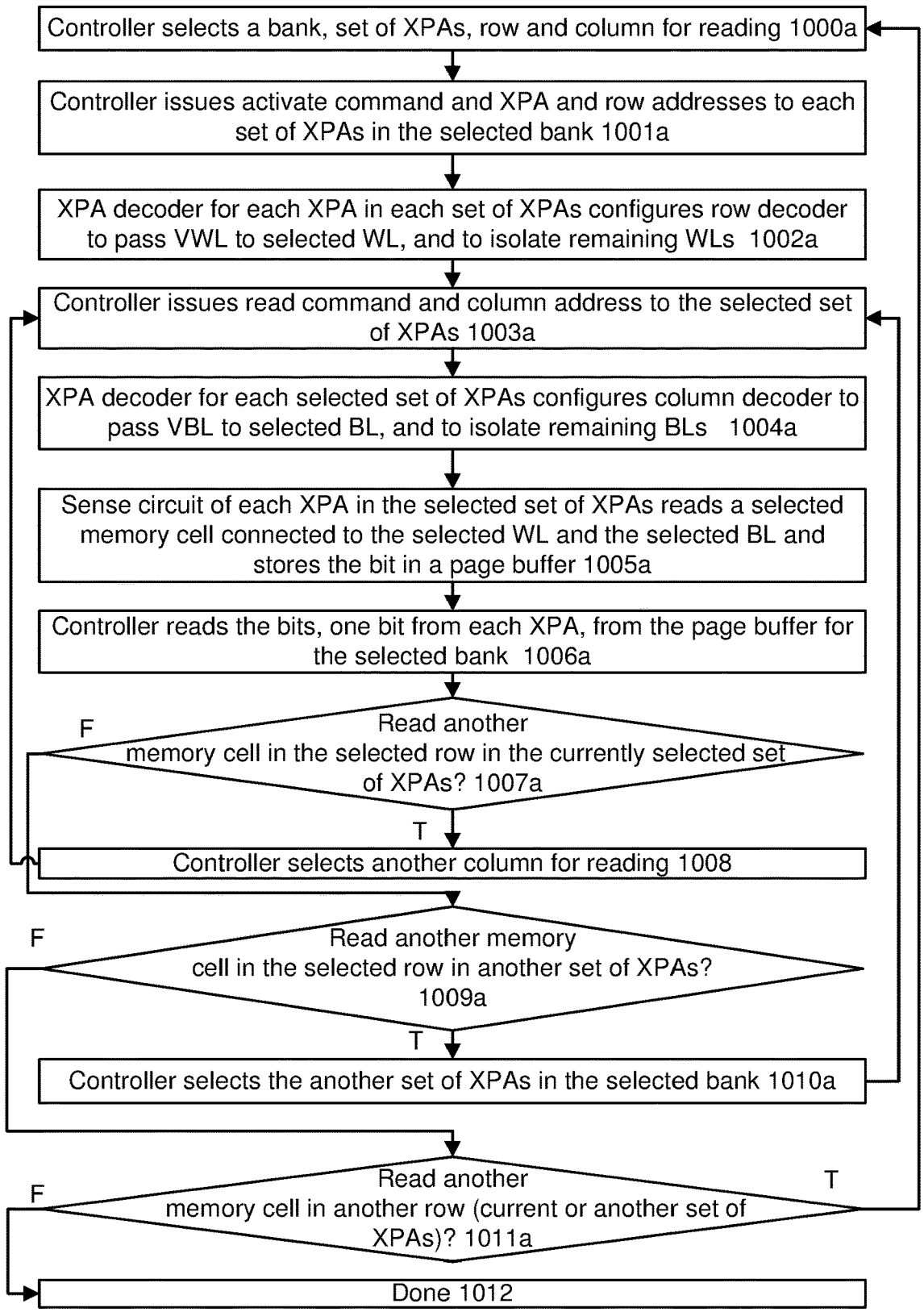
FIG. 10B depicts a flowchart of an example process for reading memory cells in different sets of crosspoint arrays, consistent with case (4) of FIG. 12.

FIG. 10B depicts a flowchart of an example process for reading memory cells in different sets of crosspoint arrays, consistent with case (4) of FIG. 12. The process includes some repeated steps from FIG. 10A as indicated by the repeated reference numbers 1008 and 1012. Steps 1000a-1007a and 1009a-1011a are similar to steps 1000-1007 and 1009-1011, respectively, in FIG. 10A.

At step 1000a, the controller selects a bank, sets of XPAs, and a row and column for reading. This can be in response to a read command received from a host, for example. This step may be performed internally within the controller before sending related commands and addresses to the banks of memory cells. At step 1001a, the controller issues an activate command and XPA and row addresses to each set of XPAs in the selected bank.

At step 1002a, in response, the XPA decoder 210a for each XPA in each set of XPAs configures a row decoder to pass VWL to the selected WL, and to isolate the remaining WLs. At step 1003a, the controller issues a read command and a column address to the selected set of XPAs. At step 1004a, in response, the XPA decoder for each selected set of XPAs configures the column decoder to pass VBL to a selected BL, and to isolate the remaining BLs. At step 1005a, the sense circuit of each XPA in the selected set of XPAs reads a selected memory cell connected to the selected WL and the selected BL and stores the data, e.g., a bit, in a page buffer. At step 1006a, the controller reads the bits, one bit from each XPA, from the page buffer for the selected bank.

A decision step 1007a determines whether another memory cell in the selected row in the currently selected set of XPAs is to be read. If the decision step 1007a is true, the controller selects another column for reading, at step 1008. Step 1003a is then repeated, where the controller issues a read command and a new column address to the current set of XPAs. If the decision step 1007*a* is false, a decision step 1009*a* determines whether another memory cell in the selected row in another set of XPAs is to be read. If the decision step 1009*a* is true, the controller selects the another set of XPAs in the selected bank at step 1010*a*. Step 1003*a* is then repeated, where the controller issues a read command and a column address to a new set of XPAs. If decision step 1009*a* is false, a decision step 1011*a* determines whether another memory cell in another row (in the currently selected set of XPAs or in another set of XPAs) is to be read. If decision step 1011*a* is false, the read operations are done, at step 1012. If decision step 1011*a* is true, step 100*a* is repeated.

Decision steps 1007*a*, 1009*a* and 1011*a* represent three different cases of a next read operation. Decision step 1007*a* determines if the next read operation is in the same row and set of XPAs as the previous read operation. Decision step 1009*a* determines if the next read operation is in the same row as the previous read operation but in a new set of XPAs. Decision step 1011*a* determines if the next read operation is in a different row than the row of the previous read operation.

The command and addresses of FIG. 11A-11E can be provided by the controller 120 to the XPA decoder 210 or 210*a*.

FIG. 10C depicts a flowchart of an example process for performing step 902 of FIG. 9A, 902*a* of FIG. 9B, 1002 of FIG. 10A and 1002*a* of FIG. 10B. Step 1020 includes providing a word line decoder transistor for a selected word line in a conductive state. Step 1021 includes providing word line decoder transistors for unselected word lines in a non-conductive state. Step 1022 includes providing a word line isolation transistor for a selected word line in a non-conductive state. Step 1023 includes providing word line isolation transistors for unselected word lines in a conductive state.

FIG. 10D depicts a flowchart of an example process for performing step 904 of FIG. 9A, 904*a* of FIG. 9B, 1004 of FIG. 10A and 1004*a* of FIG. 10B. Step 1030 includes providing a bit line decoder transistor for a selected bit line in a conductive state. Step 1031 includes providing bit line decoder transistors for unselected bit lines in a non-conductive state. Step 1032 includes providing a bit line isolation transistor for a selected bit line in a non-conductive state. Step 1033 includes providing bit line isolation transistors for unselected bit lines in a conductive state.

FIG. 11A depicts a sequence 1100 including a command and addresses provided by the controller to select a row, consistent with cases (2) and (4) of FIG. 12. The controller can issue an activate command 1101 to the banks to instruct them that addresses will follow which identify rows to be selected, e.g., for a read operation. A bank address 1102 identifies one or more banks which are selected for the operation. A row address 1104 identifies a row of the XPAs in the bank.

FIG. 11B depicts a sequence 1110 including a command and addresses provided by the controller to select rows of memory cells, consistent with cases (1) and (3) of FIG. 12. The controller can issue the activate command 1101. The bank address 1102 identifies one or more banks which are selected for the operation. A XPA address 1103 identifies a selected XPA within a group of XPAs. The row address 1104 identifies a row of the selected XPA.

FIG. 11C depicts a sequence 1120 including a command and an address provided by the controller to perform a read operation and to select a column, consistent with cases (1) and (2) of FIG. 12. A read command 1131 informs the banks that an address will follow which identify columns to be selected, e.g., for a read operation. A column address 1132 selects a column.

FIG. 11D depicts a sequence 1130 including a command and addresses provided by the controller to perform a read operation and to select a set of XPA groups and a column, consistent with case (3) of FIG. 12. The read command 1131 is issued. A set of XPA groups address 1141 selects a set of XPA groups among multiple available XPA groups in a bank. The column address 1132 selects a column.

FIG. 11E depicts a sequence 1140 including a command and addresses provided by the controller to perform a read operation and to select a set of XPAs and a column, consistent with case (4) of FIG. 12. The read command 1131 is issued. A set of XPAs address 1151 selects a set of XPAs among multiple available sets of XPAs in a bank. The column address 1132 selects a column.

FIG. 12 depicts example cases for the crosspoint arrays (XPAs) regarding the use of groups and sets, with a cross-reference to the figures. In case (1), the XPAs are grouped and not in sets. This case is consistent with FIGS. 1A, 5A, 5B, 9A, 11B and 11C. In case (2), the XPAs are not grouped and not in sets. This case is consistent with FIGS. 1C, 6A, 6B, 9B, 11A and 11C. In case (3), the XPAs are grouped and in sets. This case is consistent with FIGS. 1D, 7A-7C, 10A, 11B and 11D. In case (4), the XPAs are not grouped, but are in sets. This case is consistent with FIGS. 1E, 8A, 8B, 10B, 11A and 11E.

Accordingly, it can be seen that, in one implementation, an apparatus comprises:

a first set of crosspoint array groups in a bank, each group in the first set of crosspoint array groups comprising a first group decoder and a selected crosspoint array, and each selected crosspoint array comprising non-volatile memory cells; for each selected crosspoint array in each group in the first set of crosspoint array groups, a row decoder and a column decoder connected to the first group decoder, word lines connected to the row decoder and non-volatile memory cells of the selected crosspoint array, and bit lines connected to the column decoder and the non-volatile memory cells of the selected crosspoint array, the word lines comprise a selected word line connected to a first selected memory cell and the bit lines comprise a selected bit line connected to the first selected memory cell; and a controller connected to each first group decoder.

The controller, to read each first selected memory cell, is configured to: issue an activate command, a row address and a crosspoint array address to the first group decoder to configure the row decoder of the selected crosspoint array to pass a word line read voltage to the selected word line, the selected crosspoint array is identified by the crosspoint array address and the selected word line is identified by the row address; and issue a first read command and a first column address to the first group decoder to configure the column decoder of the selected crosspoint array to pass a bit line read voltage to the selected bit line, the selected bit line is identified by the first column address.

In another implementation, a method comprises: receiving an activate command, a row address and a crosspoint array address at each group in a first set of crosspoint array groups, each group in the first set of crosspoint array groups comprising non-volatile memory cells, word lines connected to a row decoder and bit lines connected to a column decoder; in response to the receiving of the activate command, the row address and the crosspoint array address, for each group in the first set of crosspoint array groups, configuring a row decoder of a selected crosspoint array identified by the crosspoint array address to pass a word line read voltage to a selected word line identified by the row address; in response to receiving a first read command and a first column address at each group in the first set of crosspoint array groups, configuring a column decoder of the selected crosspoint array to pass a bit line read voltage to a selected bit line identified by the first column address, and reading a first selected memory cell connected to the selected word line and the selected bit line; and continuing the configuring of the row decoder after the reading of the first selected memory cell in each group in the first set of crosspoint array groups, at least until a reading of a second selected memory cell in each group in the first set of crosspoint array groups, without again receiving the row address at each group in the first set of crosspoint array groups, the second selected memory cell is connected to the selected word line.

In another implementation, an apparatus comprises: a controller, the controller configured to: issue a command to configure row decoders for a first set of crosspoint arrays and a second set of crosspoint arrays; issue a first command to configure column decoders for the first set of crosspoint arrays for reading selected non-volatile memory cells in the first set of crosspoint arrays; and issue a second command to configure column decoders for the second set of crosspoint arrays for reading selected non-volatile memory cells in the second set of crosspoint arrays, without re-issuing the command to configure the row decoders to the second set of crosspoint arrays. The apparatus further comprises: means for configuring respective row decoders of the first set of crosspoint arrays for reading in response to the command to configure the row decoders; means for configuring respective row decoders of the second set of crosspoint arrays for reading in response to the command to configure the row decoders; means for configuring respective column decoders of the first set of crosspoint arrays for reading in response to the first command; and means for configuring respective column decoders of the second set of crosspoint arrays for reading in response to the second command.

The means for configuring respective row decoders can include, e.g., an XPA group decoder 210 or XPA decoder 210*a*, word line decoder transistors Wd0-Wd3 and word line isolation transistors W0-W3. The means for configuring respective row decoders can perform the process of the flowchart of FIG. 10C.

The means for configuring respective column decoders can include, e.g., an XPA group decoder 210 or XPA decoder 210*a*, bit line decoder transistors Bd0-Bd3 and bit line isolation transistors B0-B3. The means for configuring respective column decoders can perform the process of the flowchart of FIG. 10D.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a first set of crosspoint array groups in a bank, each group in the first set of crosspoint array groups comprising a first group decoder and a selected crosspoint array, each selected crosspoint array comprising non-volatile memory cells, and each group in the first set of crosspoint array groups is configured for reading one memory cell at a time;

for each selected crosspoint array in each group in the first set of crosspoint array groups, a row decoder and a column decoder connected to the first group decoder, word lines connected to the row decoder and non-volatile memory cells of the selected crosspoint array, and bit lines connected to the column decoder and the non-volatile memory cells of the selected crosspoint array, the word lines comprise a selected word line connected to a first selected memory cell and the bit lines comprise a selected bit line connected to the first selected memory cell; and a controller connected to each first group decoder, the controller, to read each first selected memory cell, is configured to:
issue an activate command, a row address and a crosspoint array address to the first group decoder to configure the row decoder of the selected crosspoint array to pass a word line read voltage to the selected word line, the selected crosspoint array is identified by the crosspoint array address and the selected word line is identified by the row address; and
issue a first read command and a first column address to the first group decoder to configure the column decoder of the selected crosspoint array to pass a bit line read voltage to the selected bit line, the selected bit line is identified by the first column address.

2. The apparatus of claim 1, further comprising:
a page buffer configured to receive, in parallel, a bit of data from each first selected memory cell in connection with the first read command.

3. The apparatus of claim 1, wherein for each selected crosspoint array in the first set of crosspoint array groups, the controller, to perform a read of a second selected memory cell connected to the selected word line and a second selected bit line, is configured to:
issue a second read command and a second column address to the first group decoder to configure the column decoder to pass a bit line read voltage to the second selected bit line, the second selected bit line is identified by the second column address.

4. The apparatus of claim 3, further comprising:
a page buffer configured to receive, in parallel, a bit of data from the first selected memory cell of each group of the first set of crosspoint array groups, in connection with the first read command, for read out by the controller, and to subsequently receive, in parallel, a bit of data from the second selected memory cell of each group of the first set of crosspoint array groups, in connection with the second read command, for read out by the controller.

5. The apparatus of claim 3, wherein for each selected crosspoint array in the first set of crosspoint array groups:
after the read of the first selected memory cell, the row decoder of the selected crosspoint array maintains its configuration to pass the word line read voltage to the selected word line at least until after the read of the second selected memory cell, without the controller issuing another activate command to the first set of crosspoint array groups.

6. The apparatus of claim 3, wherein for each selected crosspoint array in the first set of crosspoint array groups:

after the read of the first selected memory cell, the row decoder of the selected crosspoint array maintains its configuration to pass the word line read voltage to the selected word line at least until after the read of the second selected memory cell, without the controller re-issuing the row address to the first set of crosspoint array groups.

7. The apparatus of claim 3, wherein for each selected crosspoint array in the first set of crosspoint array groups:

the controller, to configure the row decoder of the selected crosspoint array to pass the word line read voltage, is configured to provide a word line decoder transistor connected in series with the selected word line in a conductive state and to provide word line decoder transistors connected in series with unselected word lines in a non-conductive state; and after the read of the first selected memory cell, the row decoder of the selected crosspoint array maintains its configuration to pass the word line read voltage to the selected word line at least until after the read of the second selected memory cell by maintaining the word line decoder transistor connected in series with the selected word line in the conductive state and by maintaining the word line decoder transistors connected in series with the unselected word lines in the non-conductive state.

8. The apparatus of claim 3, wherein for each selected crosspoint array in the first set of crosspoint array groups:

the controller, to configure the row decoder of the selected crosspoint array to pass the word line read voltage, is configured to provide an isolation transistor connected between an isolation voltage source and the selected word line in a non-conductive state, and to provide isolation transistors connected between the isolation voltage source and unselected word lines in a conductive state; and after the read of the first selected memory cell, the row decoder of the selected crosspoint array maintains its configuration to pass the word line read voltage to the selected word line at least until after the read of the second selected memory cell by maintaining the isolation transistor connected to the selected word line in the non-conductive state and by maintaining the isolation transistors connected to the unselected word lines in the conductive state.

9. The apparatus of claim 1, further comprising:

a second set of crosspoint array groups in the bank, each group in the second set of crosspoint array groups comprising a second group decoder and a selected crosspoint array, and each selected crosspoint array in the second set of crosspoint array groups comprising a crosspoint array of non-volatile memory cells;

for each selected crosspoint array in each group in the second set of crosspoint array groups, a row decoder and a column decoder connected to the second group decoder, word lines connected to the row decoder and non-volatile memory cells of the selected crosspoint array, and bit lines connected to the column decoder and the non-volatile memory cells of the selected crosspoint array, the word lines comprise a selected word line connected to a first selected memory cell and the bit lines comprise a selected bit line connected to the first selected memory cell, wherein;

for each selected crosspoint array in the second set of crosspoint array groups, the controller, to read each second selected memory cell, is configured to:

issue the activate command, the row address and the crosspoint array address to the second group decoder to configure the row decoder to pass the word line read voltage to a selected word line identified by the row address; and the issuing of the activate command, the row address and the crosspoint array address to the second group decoders is in parallel with the issuing of the activate command, the row address and the crosspoint array address to the first group decoders.

10. The apparatus of claim 9, wherein:

the controller, to read a selected memory cell connected to the selected word line and an additional selected bit line for each selected crosspoint array in the second set of crosspoint array groups, is configured to issue an additional read command and an additional column address to the second group decoder to configure the column decoder of the selected crosspoint array to pass a bit line voltage for reading to the additional selected bit line, the additional selected bit line is identified by the additional column address.

11. The apparatus of claim 10, wherein:

the read of the first selected memory cell for each group in the first set of crosspoint array groups overlaps with the read of the second selected memory cell for each group in the second set of crosspoint array groups.

12. A method, comprising:

receiving an activate command, a row address and a crosspoint array address at each group in a first set of crosspoint array groups, each group in the first set of crosspoint array groups comprising non-volatile memory cells, and word lines are connected to a row decoder and bit lines are connected to a column decoder for each crosspoint array in each group in the first set of crosspoint array groups;

in response to the receiving of the activate command, the row address and the crosspoint array address, for each group in the first set of crosspoint array groups, configuring a row decoder of a selected crosspoint array identified by the crosspoint array address to pass a word line read voltage to a selected word line identified by the row address;

in response to receiving a first read command and a first column address at each group in the first set of crosspoint array groups, configuring a column decoder of the selected crosspoint array to pass a bit line read voltage to a selected bit line identified by the first column address, and reading a first selected memory cell connected to the selected word line and the selected bit line; and continuing the configuring of the row decoder after the reading of the first selected memory cell in each group in the first set of crosspoint array groups, at least until a reading of a second selected memory cell in each group in the first set of crosspoint array groups, without again receiving the row address at each group in the first set of crosspoint array groups, the second selected memory cell is connected to the selected word line.

13. The method of claim 12, wherein for each group in the first set of crosspoint array groups, the reading of the second selected memory cell comprises:

receiving a second read command and a second column address; and in response to the receiving of the second read command and the second column address, configuring the column decoder of the selected crosspoint array to pass a bit line read voltage to a second selected bit line identified by the second column address, the second selected memory cell is connected to the second selected bit line.

14. The method of claim 12, further comprising:

receiving the activate command, the row address and the crosspoint array address at each group in a second set of crosspoint array groups, each group in the second set of crosspoint array groups comprising crosspoint arrays, each crosspoint array comprising a crosspoint array of non-volatile memory cells, and a row decoder is connected to word lines and a column decoder is connected to bit lines for each crosspoint array in each group in the second set of crosspoint array groups;

for each group in the second set of crosspoint array groups, in response to the receiving of the activate command, the row address and the crosspoint array address, configuring a row decoder of a selected crosspoint array identified by the crosspoint array address to pass a word line read voltage to a selected word line identified by the row address; and at each group in the second set of crosspoint array groups, in response to receiving a second read command and a second column address, configuring a column decoder of the selected crosspoint array to pass a bit line read voltage to a second selected bit line identified by the second column address, and reading a second selected memory cell connected to the selected word line and the second selected bit line.

15. An apparatus, comprising:

a controller, the controller is configured to:
  issue a command to configure row decoders for a first set of crosspoint arrays and a second set of crosspoint arrays;
  issue a first command to configure column decoders for the first set of crosspoint arrays for reading selected non-volatile memory cells in the first set of crosspoint arrays; and
  issue a second command to configure column decoders for the second set of crosspoint arrays for reading selected non-volatile memory cells in the second set of crosspoint arrays, without re-issuing the command to configure the row decoders to the second set of crosspoint arrays;

means for configuring respective row decoders of the first set of crosspoint arrays for reading in response to the command to configure the row decoders;

means for configuring respective row decoders of the second set of crosspoint arrays for reading in response to the command to configure the row decoders;

means for configuring respective column decoders of the first set of crosspoint arrays for reading in response to the first command; and means for configuring respective column decoders of the second set of crosspoint arrays for reading in response to the second command.

16. The apparatus of claim 15, wherein:
the reading in the first set of crosspoint arrays overlaps with the reading in the second set of crosspoint arrays.

17. The apparatus of claim 15, wherein:
the means for configuring the respective row decoders of the first set of crosspoint arrays comprise word line decoder transistors and word line isolation transistors; and
the means for configuring the respective row decoders of the second set of crosspoint arrays comprise word line decoder transistors and word line isolation transistors.

18. The apparatus of claim 15, wherein:
the means for configuring the respective column decoders of the first set of crosspoint arrays comprise bit line decoder transistors and bit line isolation transistors; and
the means for configuring the respective column decoders of the second set of crosspoint arrays comprise bit line decoder transistors and bit line isolation transistors.

19. The apparatus of claim 15, wherein:
the command to configure the row decoders comprises a row address;
the first command comprises a first column address; and
the second command comprises a second column address.

* * * * *